United States Patent
Guerrera et al.

(10) Patent No.: US 9,748,071 B2
(45) Date of Patent: Aug. 29, 2017

(54) INDIVIDUALLY SWITCHED FIELD EMISSION ARRAYS

(71) Applicant: Massachusetts Institute of Technology, Cambridge, MA (US)

(72) Inventors: Stephen Angelo Guerrera, Jamaica Plain, MA (US); Akintunde I. Akinwande, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 29 days.

(21) Appl. No.: 14/765,759

(22) PCT Filed: Feb. 5, 2014

(86) PCT No.: PCT/US2014/014926
§ 371 (c)(1),
(2) Date: Aug. 4, 2015

(87) PCT Pub. No.: WO2014/124041
PCT Pub. Date: Aug. 14, 2014

(65) Prior Publication Data
US 2015/0371810 A1    Dec. 24, 2015

Related U.S. Application Data

(60) Provisional application No. 61/799,973, filed on Mar. 15, 2013, provisional application No. 61/760,729, filed on Feb. 5, 2013.

(51) Int. Cl.
*H01J 37/073* (2006.01)
*H01L 21/00* (2006.01)
(Continued)

(52) U.S. Cl.
CPC .......... *H01J 37/073* (2013.01); *H01J 37/065* (2013.01); *H01J 37/3007* (2013.01);
(Continued)

(58) Field of Classification Search
CPC .... H01J 37/073; H01J 37/065; H01J 37/3007; H01J 37/3174; H01J 37/3177;
(Continued)

(56) References Cited

U.S. PATENT DOCUMENTS

| 4,008,412 A | 2/1977 | Yuito et al. |
| 5,199,917 A | 4/1993 | MacDonald et al. |

(Continued)

FOREIGN PATENT DOCUMENTS

KR    10-2015-0113635 A    10/2015

OTHER PUBLICATIONS

International Search Report and Written Opinion for Application No. PCT/US2014/014926 mailed Nov. 18, 2014.
(Continued)

*Primary Examiner* — David E Smith
(74) *Attorney, Agent, or Firm* — Wolf, Greenfield & Sacks, P.C.

(57) ABSTRACT

An electron beam apparatus is disclosed that includes a plurality of current source elements disposed in at least one field emitter array. Each current source element can be a gated vertical transistor, an ungated vertical transistor, or a current controlled channel that is proximate to an optically-modulated current source. The electron beam apparatus includes a plurality of field emitter tips, each field emitter tip of the plurality of field emitter tips being coupled to a current source element of the plurality of current source elements. The electron beam apparatus is configured to allow selective activation of one or more of the current source elements.

40 Claims, 32 Drawing Sheets

(51) Int. Cl.
    *H01J 37/065*     (2006.01)
    *H01J 37/317*     (2006.01)
    *H01J 37/30*     (2006.01)

(52) U.S. Cl.
    CPC ...... *H01J 37/3174* (2013.01); *H01J 37/3177* (2013.01); *H01L 21/00* (2013.01); *H01J 2237/0473* (2013.01); *H01J 2237/063* (2013.01); *H01J 2237/3175* (2013.01); *H01J 2237/31781* (2013.01)

(58) Field of Classification Search
    CPC ......... H01J 2237/0473; H01J 2237/063; H01J 2237/3175; H01J 2237/31781; H01L 21/00
    See application file for complete search history.

(56) References Cited

U.S. PATENT DOCUMENTS

| | | | |
|---|---|---|---|
| 5,266,530 | A | 11/1993 | Bagley et al. |
| 5,527,200 | A | 6/1996 | Lee et al. |
| 5,627,427 | A | 5/1997 | Das et al. |
| 5,647,785 | A | 7/1997 | Jones et al. |
| 5,653,619 | A | 8/1997 | Cloud et al. |
| 5,688,707 | A | 11/1997 | Lee et al. |
| 5,857,885 | A | 1/1999 | Laou et al. |
| 5,892,231 | A * | 4/1999 | Baylor ................ B82Y 10/00 250/398 |
| 5,966,588 | A | 10/1999 | Ju et al. |
| 5,989,931 | A | 11/1999 | Ghodsian et al. |
| 6,069,018 | A | 5/2000 | Song et al. |
| 6,165,808 | A | 12/2000 | Zhang |
| 6,312,966 | B1 | 11/2001 | Tseng |
| 6,387,717 | B1 | 5/2002 | Blalock et al. |
| 6,394,871 | B2 | 5/2002 | Lee |
| 6,417,016 | B1 | 7/2002 | Gilton et al. |
| 6,444,401 | B1 | 9/2002 | Lee |
| 6,448,701 | B1 | 9/2002 | Hsu |
| 6,963,160 | B2 | 11/2005 | Schueller et al. |
| 7,259,051 | B2 | 8/2007 | Chen et al. |
| 7,326,328 | B2 | 2/2008 | Hudspeth et al. |
| 8,198,106 | B2 | 6/2012 | Akinwande et al. |
| 9,053,890 | B2 | 6/2015 | Sun et al. |
| 9,196,447 | B2 | 11/2015 | Fomani et al. |
| 2003/0038244 | A1* | 2/2003 | Thomas ................ B82Y 10/00 250/398 |
| 2003/0178583 | A1* | 9/2003 | Kampherbeek ........ B82Y 10/00 250/492.3 |
| 2004/0004588 | A1* | 1/2004 | Kawase ................ G09G 3/22 345/74.1 |
| 2004/0238809 | A1* | 12/2004 | Adamec ............ H01J 1/3044 257/10 |
| 2006/0043873 | A1* | 3/2006 | Hwang ................ H01J 3/022 313/495 |
| 2006/0151774 | A1* | 7/2006 | Lee ........................ B82Y 10/00 257/10 |
| 2007/0114434 | A1 | 5/2007 | Chang et al. |
| 2007/0235772 | A1* | 10/2007 | Jin ........................ G09G 3/22 257/236 |
| 2012/0156453 | A1 | 6/2012 | Gonzalez et al. |
| 2012/0224155 | A1 | 9/2012 | Kruit |
| 2014/0285084 | A1 | 9/2014 | Fomani et al. |
| 2016/0254114 | A1 | 9/2016 | Fomani et al. |

OTHER PUBLICATIONS

International Preliminary Report and Patentability for Application No. PCT/US2014/014926 mailed Aug. 11, 2015.
Baylor et al., Digital electrostatic electronic-beam array lithography. Journal of vacuum science & technology, American Vacuum Society. 2002; 20(6): 2646-50.
International Search Report and Written Opinion for Application No. PCT/US2013/067559 mailed Feb. 24, 2014.
International Preliminary Report and Patentability for Application No. PCT/US2013/067559 mailed Jun. 18, 2015.
Invitation to Pay Additional Fees for Application No. PCT/US2016/068532 mailed Mar. 8, 2017.
Ding et al., Highly Uniform and Low Turn-On Voltage Si Field Emitter Arrays Fabricated Using Chemical Mechanical Polishing. IEEE Electron Device Letters. 2000; 21(2):66-9.
Ding et al., Silicon Field Emission Arrays With Atomically Sharp Tips: Turn-On Voltage and the Effect of Tip Radius Distribution. IEEE Transactions on Electron Devices. 2002; 49(12):2333-42.
Guillorn et al., Fabrication of gated cathode structures using an in situ grown vertically aligned carbon nanofiber as a field emission element. J. Vac. Sci. Technol B. 2001;19(2):573-8.
Guillorn et al., Microfabricated field emission devices using carbon nanofibers as cathode elements. J. Vac. Sci. Technol. vol. B. 2001;19(6):2598-2601.
Guillorn et al., Operation of a gated field emitter using an individual carbon nanofiber cathode. Applied Physics Letters. 2001;79(21):3506-8.
Guillorn et al., Self-aligned gated field emission devices using single carbon nanofiber cathodes. Applied Physics Letters. 2002;81(19):3660-2.
Hong et al., Silicon metal-oxide-semiconductor field effect transistor/field emission array fabricated using chemical mechanical polishing. Journal of Vacuum Science & Technology B: Microelectronics and Nanometer Structures. 2003;21(1):500-5.
Pirio et al., Fabrication and electrical characteristics of carbon nanotube field emission microcathodes with an integrated gate electrode. Nanotechnology. 2002;(13):1-4.

* cited by examiner

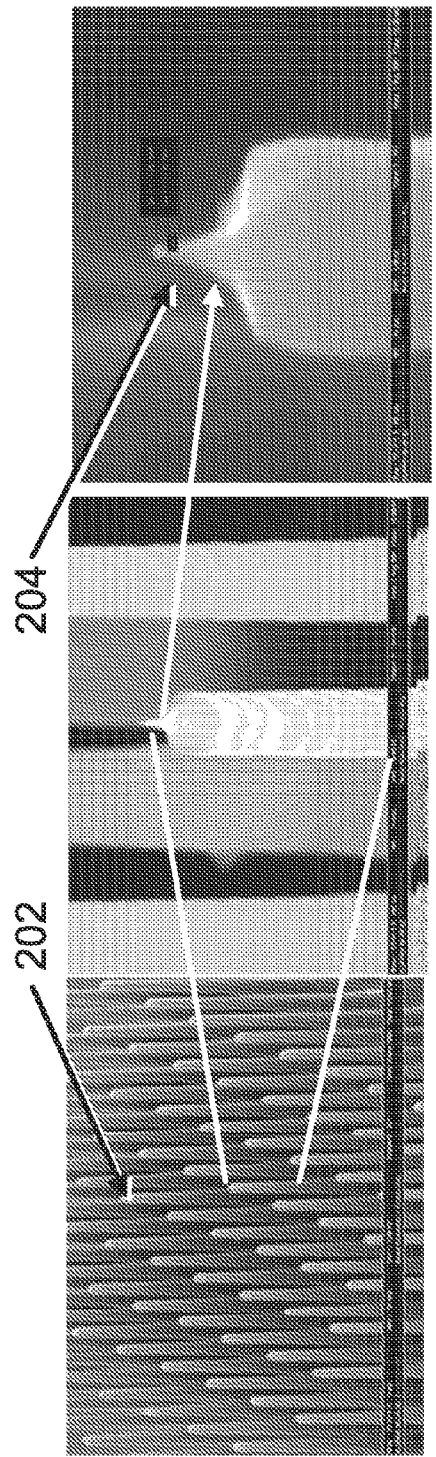
FIG. 2B
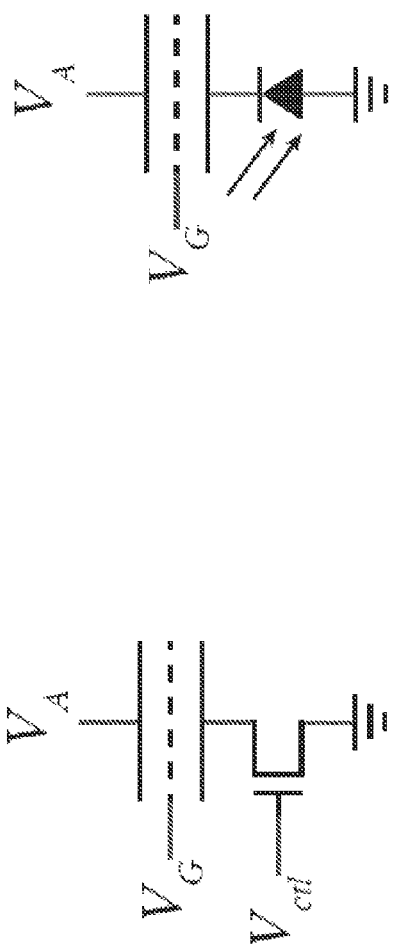
FIG. 3A
FIG. 3B

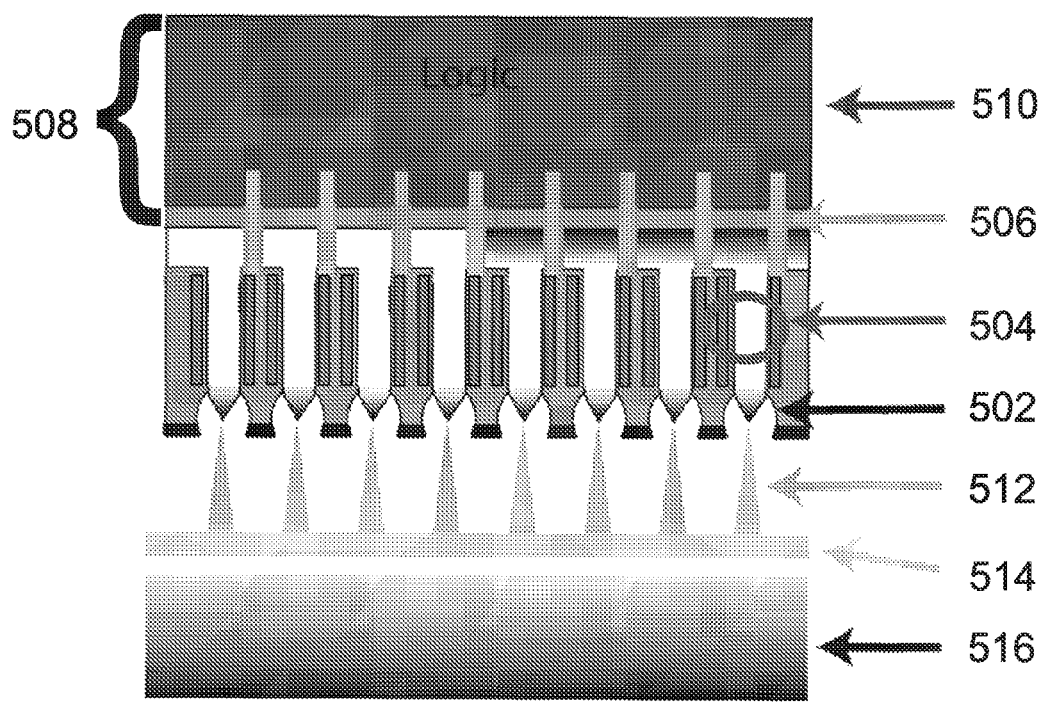
FIG. 5A
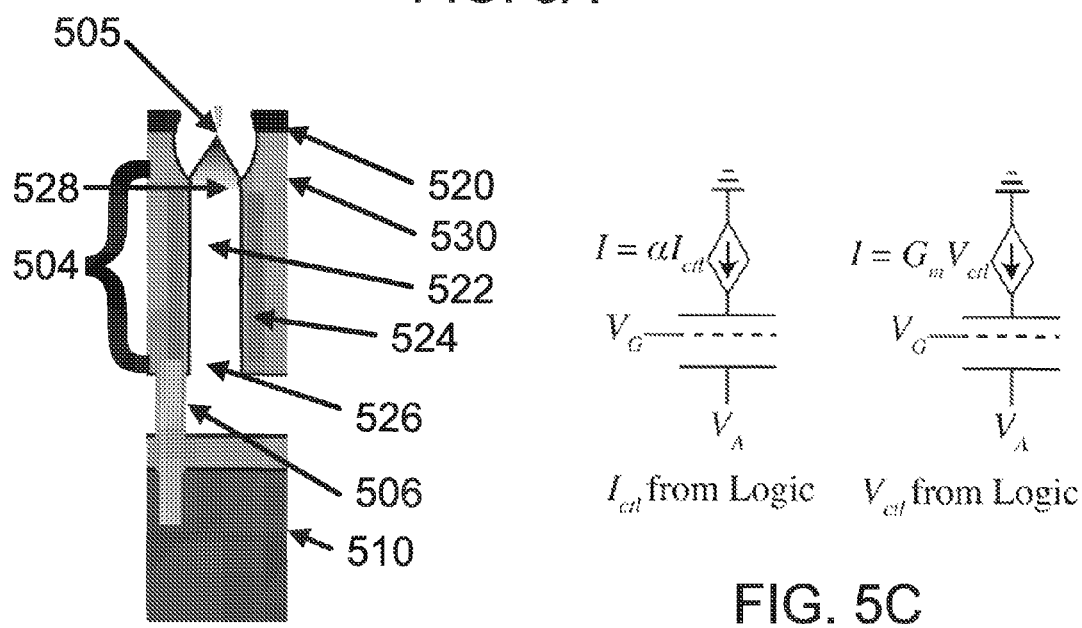
FIG. 5B
FIG. 5C

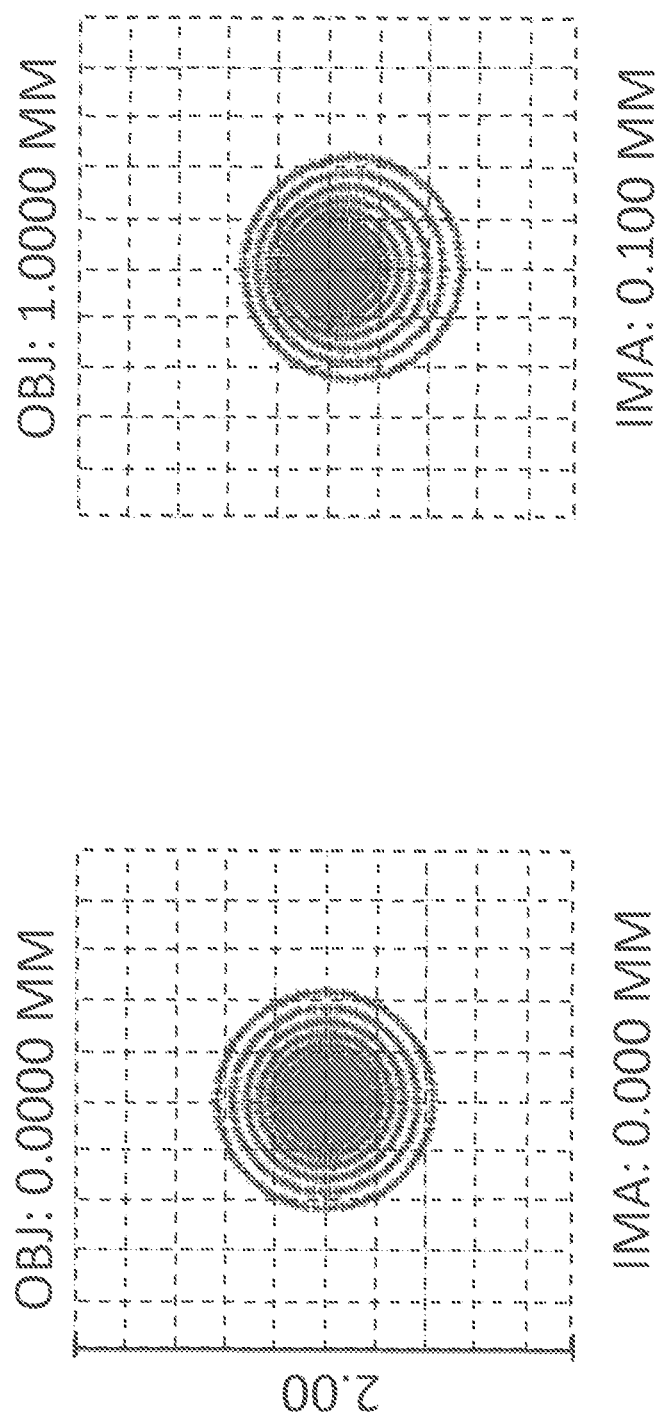

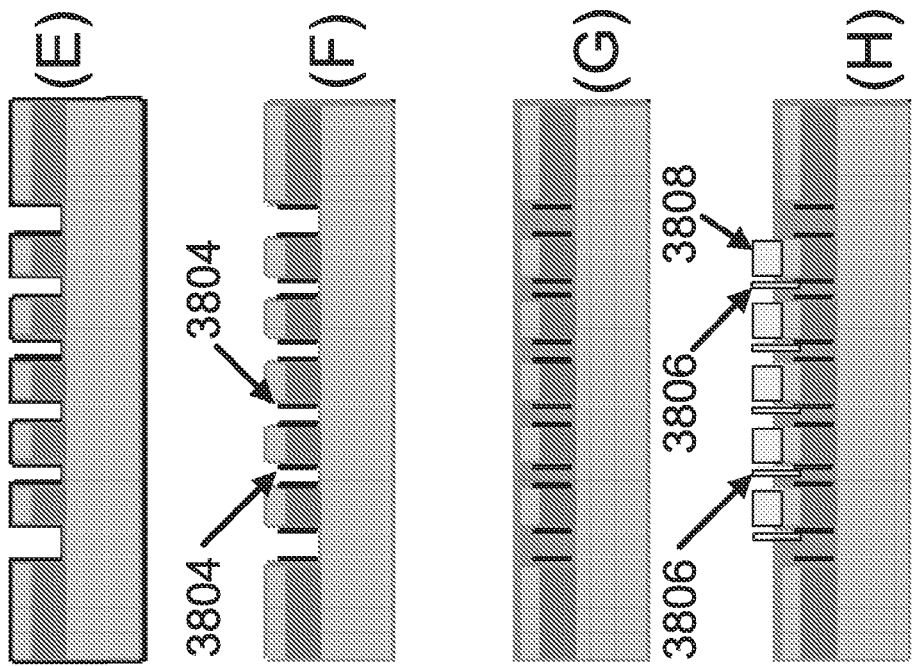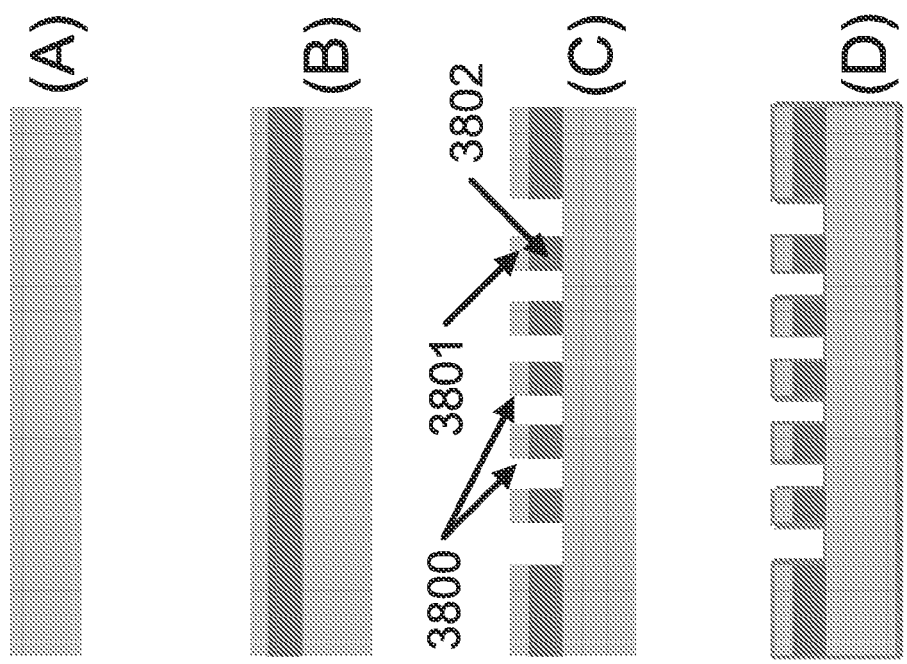
FIG. 38

INDIVIDUALLY SWITCHED FIELD EMISSION ARRAYS

CROSS-REFERENCE TO RELATED APPLICATION

This application is a 35 U.S.C. §371 national stage filing of International Application No. PCT/US2014/014926, filed on Feb. 5, 2014, which claims a priority benefit to U.S. Provisional Application No. 61/760,729, filed on Feb. 5, 2013, entitled "Individually Switched Field Emission Arrays," and U.S. Provisional Application No. 61/799,973, filed on Mar. 15, 2013, entitled "Individually Switched Field Emission Arrays," each of which is hereby incorporated by reference in its entirety, including drawings.

GOVERNMENT SUPPORT

This invention was made at least in part using government support under contract no. N66001-12-1-4212 awarded by the Defense Advanced Research Projects Agency (DARPA). The government has certain rights in the invention.

BACKGROUND

As the feature sizes in modern CMOS processes continue to shrink, the complexity of patterning features (e.g., using 193-nm light sources or EUV light sources) greatly increases. This can result in a prohibitively high cost for mask sets and thus make the small-batch manufacturing of application specific integrated circuits (ASICs) not cost competitive. Electron beam lithography is a straightforward approach to produce feature sizes that scale to the end of the International Technology Roadmap for Semiconductors. However, current electron beam lithography systems have throughput that is too low to be used in production. Existing technologies that that seek to increase the throughput of e-beam lithography tools are complex and can introduce aberrations into the electron beam limiting the ultimate attainable resolution.

SUMMARY

The Inventors have appreciated that a high throughput e-beam lithography tool would be beneficial. According to the principles described herein provide, field emitter arrays with individually switched field emitter elements are provided to as a nanoscale electron sources. Any example field emitter array herein can be implemented to dynamically write patterns, thereby reducing the complexity and chance for failure.

In an example, a field emission cathode with individually switchable electron sources is provided. In an example, to address a large number of densely packed emitters in parallel, a P-I-N photodiode can be integrated in series with each emitter, and a UV laser used to modulate the P-I-N photodiodes to switch the field emitter electron sources on and off. In another example, a controlled current source formed as a gated vertical transistor (also referred to herein as a vertical gate transistor) or as an ungated transistor (also referred to herein as a vertical ungated transistor) can be integrated with each emitter.

In an example, an electron beam system or apparatus is provided that includes a substrate, a plurality of field emitter elements disposed over the substrate in at least one array, and at least one extraction gate electrode disposed proximate to the plurality of field emitter elements. Each field emitter element of the plurality of field emitter elements includes a current channel region disposed at a first end of the field emitter element proximate to the substrate, a donor-doped region or an acceptor-doped region disposed at a second end of the field emitter element that is different from the first end, and a field emitter tip disposed proximate to the second end of the field emitter element. Using the at least one extraction gate electrode, a potential difference can be applied proximate to at least one field emitter tip of the plurality of field emitter elements, thereby accelerating the electrons emitted from the at least one field emitter tip in a direction away from the at least one field emitter tip.

In an example, an electron beam system or apparatus is provided that includes a substrate including an optically modulated current source, a plurality of field emitter elements disposed over the substrate in at least one array, and at least one extraction gate electrode disposed proximate to the plurality of field emitter elements. Each field emitter element of the plurality of field emitter elements includes a current channel region disposed at a first end of the field emitter element proximate to the optically modulated current source, and a field emitter tip disposed proximate to a second end of the field emitter element that is different from the first end. Using the at least one extraction gate electrode, a potential difference can be applied proximate to at least one field emitter tip of the plurality of field emitter elements, thereby accelerating electrons emitted from the at least one field emitter tip in a direction away from the at least one field emitter tip.

In an example, an electron beam system or apparatus is provided that includes a plurality of current source elements disposed in at least one array, a plurality of field emitter tips, each field emitter tip of the plurality of field emitter tips being coupled to an end of a respective current source element of the plurality of current source elements, and at least one extraction gate electrode disposed proximate to the plurality of current source elements. Each current source element includes a gated vertical transistor, an ungated vertical transistor, or a current controlled channel that is proximate to an optically modulated current source. Using the at least one extraction gate electrode, a potential difference can be applied proximate to at least one field emitter tip of the plurality of field emitter elements, where the potential difference accelerates the electrons emitted by at least one field emitter tip of the plurality of field emitter tips in a direction away from the at least one field emitter tip.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 2B shows magnified views of field emitter elements and the field emitter tips, according to the principles described herein.

FIGS. 3A and 3B show an example schematic diagrams for example field emitter array devices, according to the principles described herein.

FIG. 5A shows a cross-sectional view of an example field emitter array, according to the principles described herein.

FIG. 5B shows an example field emitter of an example array, according to the principles described herein.

FIG. 5C shows an example schematic of the control current ($I_{ctl}$) and the control voltage ($V_{ctl}$), according to the principles described herein.

FIGS. 19A and 19B show examples of the spot size from the imaging optics, according to the principles described herein.

FIGS. 38A-38H shows stages in an example fabrication process flow for fabricating field emitter arrays, according to the principles described herein.

Figure 1:
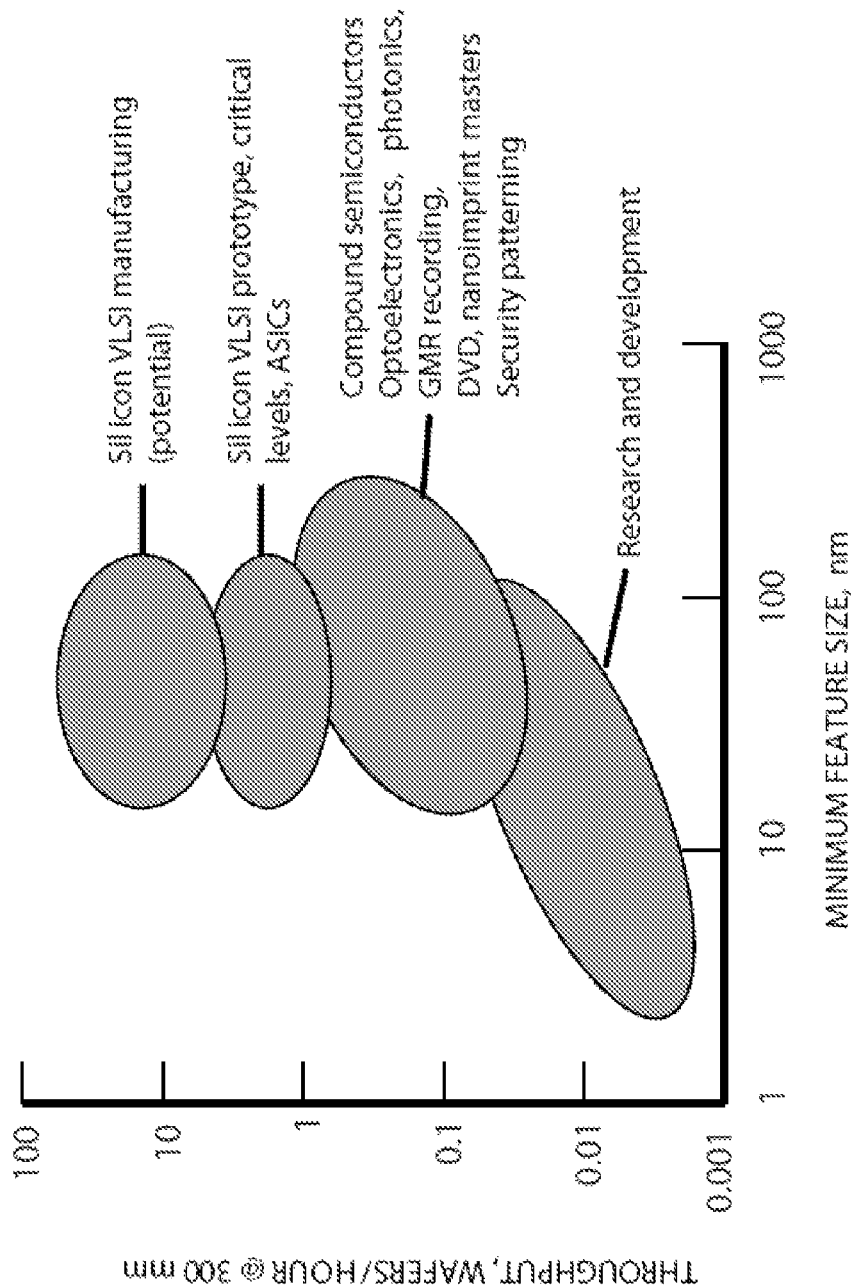
FIG. 1 shows examples of the throughput that can be useful for various applications, according to the principles described herein

The features and advantages of the present invention will become more apparent from the detailed description set forth below when taken in conjunction with the drawings.

DETAILED DESCRIPTION

Following below are more detailed descriptions of various concepts related to, and embodiments of, inventive systems, methods and apparatus for providing example field emitter arrays that include field emitter elements having high aspect ratios. It should be appreciated that various concepts introduced above and described in greater detail below may be implemented in any of numerous ways, as the disclosed concepts are not limited to any particular manner of implementation. Examples of specific implementations and applications are provided primarily for illustrative purposes.

It also should be appreciated that all combinations of the concepts discussed in greater detail below (provided such concepts are not mutually inconsistent) are contemplated as being part of the inventive subject matter disclosed herein. It also should be appreciated that terminology explicitly employed herein that also may appear in any disclosure incorporated by reference should be accorded a meaning most consistent with the particular concepts disclosed herein.

Following below are more detailed descriptions of various concepts related to, and embodiments of, inventive methods, apparatus and systems for e-beam lithography using multiple sources and for switching field emitters in an array of field emitters. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on.

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/ components with respect to the substrate (or other surface) and each other. The terms "disposed on" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

Manufacturing integrated circuits (IC) for technology with dimensions below 45 nm has been challenging and increasingly more expensive. The challenges mainly relate to the cost of executing the lithographic steps to fabricate the integrated circuits. Lithography to fabricate IC can require multiple patterning steps within the same lithography step. A challenge to the low-volume manufacturing of application specific integrated circuits (ASICs) is the cost of the photomask set. For example, it can be on the order of about USD $10 M.

The system, apparatus and method according to the principles described herein facilitate the application of a pixelated cathode to the high throughput creation of resist patterns. As a result of the expense of multiple patterning, direct-write electron beam lithography can be an attractive technique for low-volume IC manufacturing, including ASICs for applications that demand higher performance than is realizable with existing field-programmable gate arrays (FPGAs). Electron beam lithography may be able to achieve a higher resolution than photolithography. Since the deBroglie wavelength of electrons at even modest energies (less than about 100 kV) can be quite small, smaller feature resolution may be achieved under certain conditions for some materials (e.g., based on diffraction limits). For example, a 50 keV electron has a wavelength of about 0.05 Angstrom. As a result, direct-write electron beam lithography may be used under certain conditions to achieve much higher resolution patterns than traditional photolithography. FIG. 1 shows examples of the throughput that can be useful for various applications, plotted versus the desired minimum feature size. The non-limiting example applications include silicon VLSI manufacturing, compound semiconductors, optoelectronics, photonics, GMR recording, DVD, nanoimprint masters, and security patterning.

The very high costs associated with building small-batch integrated circuits with dimensions at the 45-nm node and below could be circumvented by replacing or combining optical lithography with maskless electron beam lithography. Examples of existing maskless, parallel electron beam lithography tools are the Reflection Electron Beam Lithography (REBL) system by KLA-Tencor (Milpitas, Calif.), such as described in P. Petric et al., Proc. SPIE vol. 7271, Alternative Lithographic Technologies, p. 727107 (2009), and the e-beam lithography tool by MAPPER, such as described in E. Slot et al., Proc. SPIE vol. 6921, Emerging Lithographic Technologies XII, p. 69211P (2008), each of which reference is incorporated herein in its entirety, including drawings. Maskless electron beam lithography that uses a single electron beam to perform the exposure to write patterns can have low throughput and may not be feasible for use in a cost-effective manufacturing.

According to the principles described herein, maskless electron beam lithography system, apparatus, and method are provided that uses multiple e-beam sources to write the patterns. By switching from using one electron beam to write patterns to millions of electron beams, the throughput can be greatly enhanced. As a result, an electron-beam lithography process performed according to the principles of a system, apparatus, and method described herein can be used for cost-effective, low-volume manufacturing.

An example system, apparatus, and method herein is based on a multiple electron gun structure, that could be configured to impinge spatially and temporally patterned electrons on to a resist film on a wafer. The accelerated electrons chemically alter the resist so that it becomes soluble in a developer solvent. After the resist is developed, the electron pattern is transferred to a resist. The resist can then be used to pattern a subsequent hardmask for further processing.

An example system, apparatus and method herein provides one-dimensional arrays, two-dimensional arrays, and staggered three-dimensional arrays of electron sources. Each array includes a number of field emitter elements disposed over a substrate. The field emitter elements each have a longitudinal symmetry, with a high aspect ratio of height to lateral dimension as described in greater detail below. As a non-limiting example, the field emitter elements can be fabricated in an array at a pitch of about 45 microns or less, about 40 microns or less, about 30 microns or less, about 20 microns or less, about 15 microns or less, about 10 microns or less, about 5 microns or less, about 2 microns or less, or about 1 micron or less. Each field emitter element includes a field emitter tip to emit electrons as described in greater detail below.

A staggered three-dimensional array according to the systems, apparatus and methods herein can be configured as multiple two-dimensional arrays that are dynamically mounted, such that one or more of the two-dimensional arrays may be displaced, and thereby staggered, relative to the other two-dimensional arrays in the direction of the electron emission.

An electron beam apparatus or system according to the principles described herein includes a plurality of current source elements disposed in at least one field emitter array. Each current source element can be a gated vertical transistor, an ungated vertical transistor, or a current controlled channel that is proximate to an optically-modulated current source. An example electron beam apparatus includes a plurality of field emitter tips, each field emitter tip of the plurality of field emitter tips being coupled to a current source element of the plurality of current source elements. The electron beam apparatus can be configured to allow selective activation of one or more of the current source elements.

An electron beam apparatus or system according to the principles described herein includes a current reservoir in series with each current source element of the plurality of current source elements (or each field emitter element of a plurality of field emitter elements in another example). In an example, the current reservoir can be an optically modulated current source, such as but not limited to a P-I-N diode. In another example, the current reservoir can be formed from an electrically conductive portion of a substrate. An emission of an electron beam from an emitter tip of at least one current source element (or at least one field emitter element, as applicable) can be regulated by application of a potential difference to an extraction gate electrode disposed proximate to the respective emitter tip. The amount of electrons supplied to the region of the emitter tip of at least one current source element (or at least one field emitter element, as applicable) can be regulated by the amount of current supplied by the current reservoir. As a non-limiting example, regulating the amount of light incident on a portion of the optically modulated current source (e.g., the P-I-N) can regulate the amount of electrons supplied to the region of the emitter tip. As another non-limiting example, regulating the amount of current supplied to the electrically conductive portion of the substrate (acting as a current reservoir) can regulate the amount of electrons supplied to the region of the emitter tip. In the absence of current supplied by the reservoir, fewer electrons (e.g., leakage electrons) are available at the emitter tip to be accelerated by application of the potential difference to the extraction gate electrode.

In an example where a current source element or a field emitter element is formed as a gated vertical transistor, application of a voltage to the gate of the transistor can be used as an additional way to regulate the amount of electrons supplied to the region of the emitter tip.

In any example herein, each current source element can be a field emitter element that is configured as a high aspect-ratio structure having a first end and a second end. The first end of the field emitter element is disposed proximate to a substrate. In an example, each field emitter element can include a current channel region disposed proximate to the first end, and a donor-doped region or an acceptor-doped region disposed proximate to the second end, thereby providing a field emitter element that acts as an ungated vertical transistor. In another example, each field emitter element can include a current channel region disposed proximate to the first end, a donor-doped region or an acceptor-doped region disposed proximate to the second end, and a conductive material disposed at a portion of the field emitter element (to act as a transistor gate electrode), thereby providing a field emitter element that acts as a gated vertical transistor.

In an example according to the principles herein, the current channel region of the field emitter element can be an intrinsic material, a donor-doped material or an acceptor-doped material. In a non-limiting example, the current channel region of the field emitter element can be formed from intrinsic silicon, donor-doped silicon or acceptor-doped silicon.

In an example where the current channel region of the field emitter element is an intrinsic material, the donor-doped region of the field emitter element or the acceptor-doped region of the field emitter element can be formed from inclusion of an appropriate dopant material. In an example where the current channel region of the field emitter element is formed from a doped material (either a donor-doped material or an acceptor-doped material), the donor-doped region of the field emitter element or the acceptor-doped region of the field emitter element can be formed from inclusion of a higher concentration of the same type of dopant present in the current channel region, or from a different conductivity type of dopant (in any appropriate concentration).

In any example herein, use of a different conductivity type of dopant in different regions indicates use of a donor-type dopant in one region if an acceptor-type dopant is used in another region, and vice versa.

In an example according to the principles herein, the donor-doped region of the field emitter element or the acceptor-doped region of the field emitter element can be formed from the can be formed from the same base material as the current channel region of the field emitter element or from a different type of base material from the current channel region of the field emitter element. As a non-limiting example, the current channel region and the donor-doped region (or the acceptor-doped region where appropriate) of the field emitter element can be formed from silicon as the base material. In such an example, the current channel region of the field emitter element can be formed form intrinsic silicon or lightly doped silicon, while the donor-doped region of the field emitter element or the acceptor-doped region of the field emitter element can be formed from an appropriately doped form of the intrinsic silicon, a higher concentration of the dopant in the lightly doped silicon, or a different conductivity type of dopant from the type in the current channel region. In another example, the current channel region may be formed from a first type of base material (such as but not limited to silicon or any type of conductive, semiconductive or dielectric material described herein), while the donor-doped region or the acceptor-doped regions of the field emitter element may be formed from a different types of base material, including any conductive, semiconductive dielectric material described herein.

In an example where a donor-doped region is disposed proximate to the second end, the region donor-doped region acts as an accumulation layer. In an example where an acceptor-doped region is disposed proximate to the second end, the region acceptor-doped region acts as an inversion layer. In any example herein, the donor-doped region or acceptor-doped region can be lightly doped or highly-doped.

In an example, the donor-doped region or acceptor-doped region of the current source (including a field emitter element) can be formed from a semiconductor material that is doped with n-type dopants or p-type dopants such that its conductivity varies from more insulating (e.g., about $10^7$/$cm^3$ carrier density or less) to more conductive (e.g., about $10^{16}$/$cm^3$ carrier density or more), including values of carrier density within the range from about $10^7$/$cm^3$ to about $10^{16}$/ cm³. In an example, the donor-doped region can be formed from a Group III-IV semiconductor, such as but not limited to aluminum phosphide, aluminum arsenide, gallium arsenide, or gallium nitride, doped with selenium, tellurium, silicon, or germanium. As a non-limiting example, the donor-doped semiconductor material can be n-type doped GaAs (e.g., GaAs doped with Si). In an example, the acceptor-doped region can be formed from a Group III-IV semiconductor doped with, e.g., silicon, germanium, beryllium, or cadmium. In another example, the donor-doped region can be formed from silicon or germanium doped with phosphorus, arsenic, antimony, or bismuth. In another example, the acceptor-doped region can be formed from silicon or germanium doped with boron, aluminum, or gallium.

An electron beam apparatus or system according to the principles described herein can include a plurality of current source elements disposed in at least one field emitter array, and at least one extraction gate electrode disposed proximate to the plurality of field emitter elements, to apply a potential difference proximate to at least one field emitter tip of the plurality of current source elements, thereby accelerating the electrons emitted from the at least one field emitter tip in a direction away from the at least one field emitter tip.

In any example apparatus or system according to the principles described herein, the extraction gate electrode layer can include at least two layers, including a dielectric layer disposed proximate to the field emitter elements and a conductive layer disposed over the dielectric layer. The conductive layer can be formed from, as non-limiting examples, a conductive metal, a conductive metal oxide, or a doped semiconductor material. For example, the conductive layer can be based on gold, platinum copper, tantalum, tin, tungsten, titanium, tungsten, cobalt, chromium, silver, nickel or aluminum, or a binary or ternary system of any of these conductive materials. In another example, the conductive layer can be based on a doped semiconductor material, such as but not limited to doped forms of amorphous silicon, poly-crystalline silicon, germanium, a carbon-based conductor, a III-IV semiconductor system, or other semiconductor alloy system, or any combination of these doped semiconductor materials. Non-limiting examples of III-IV semiconductor systems or semiconductor alloy systems include but are not limited to GaAs, InP, InAs, InSb, InGaAs, AlGaAs, InGaP, AlInAs, GaAsSb, AlGaP, CdZnTe, AlGaN, or any combination thereof. For example, the conductive layer can be formed from a heavily n-doped poly-crystalline silicon.

Figure 2A:
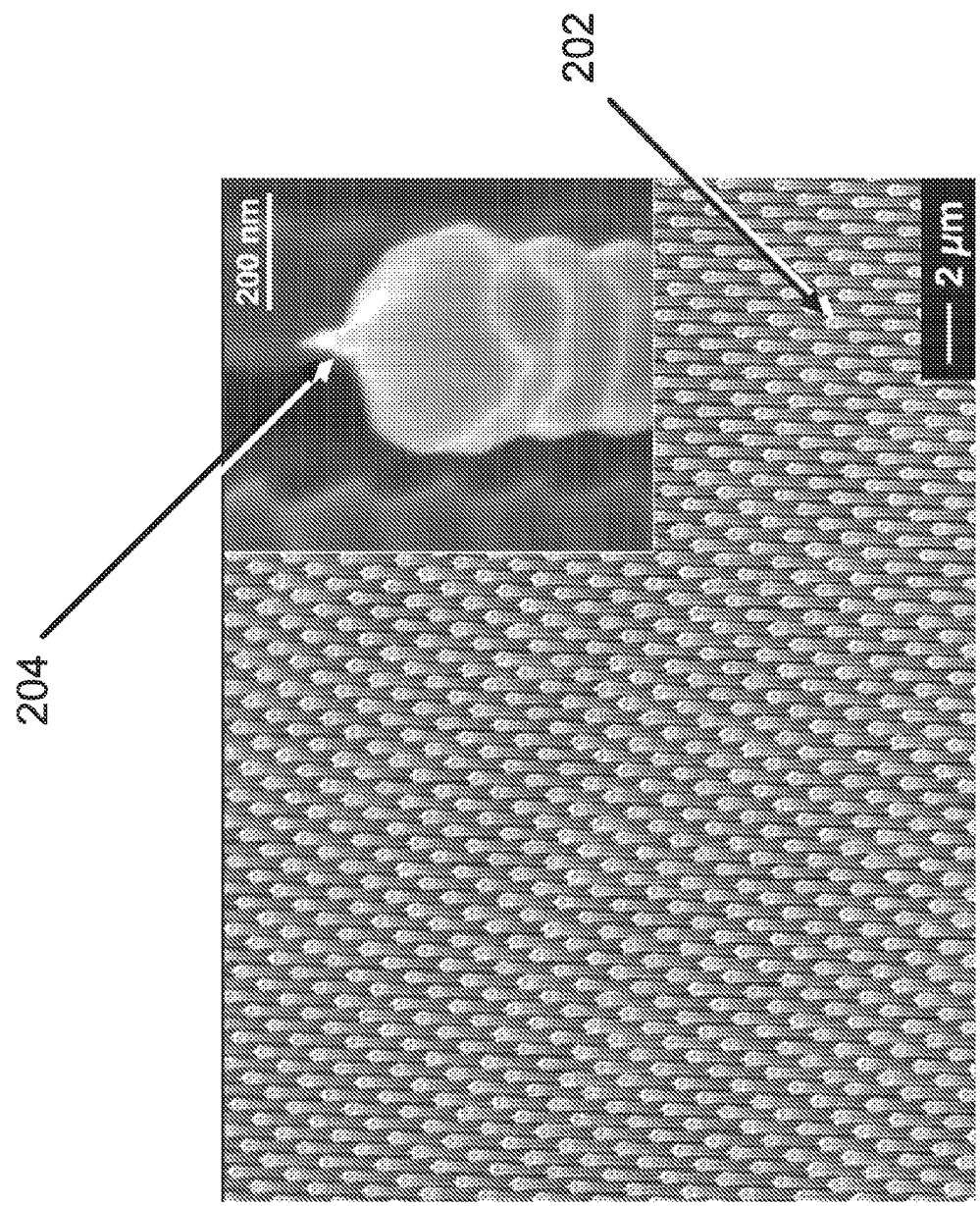
FIG. 2A shows a scanning electron micrograph of an example 2-D array of field emission elements, according to the principles described herein

An example system, apparatus and method is described that uses a massive array of individually addressable electron sources to generate individual focused or collimated electron beamlets. As non-limiting examples, the array can be formed as a one-dimensional array or a two-dimensional array. For example, a two-dimensional array can include greater than about $1 \times 10^6$ individually-addressable electron sources. FIG. 2A shows a scanning electron micrograph of an example 2-D array of field emission elements 202 that can be used as electron sources according to the principles described herein. The electron sources are formed as a 2k×2k array of field emission elements 202, each field emission element 202 being fabricated as part of a 10 micron-tall pillar structure. The example 2-D array of FIG. 2A is tightly spaced, having about a 1 micron pitch. The inset to FIG. 2A shows a magnified view of the "top" of a field emission element 202 (a pillar), showing a single field emitter tip 204 in the 2-D array. The example field emitter tip 204 is fabricated to have a tip radius of less than about 10 nm. In various examples, the example field emitter tip 204 can be fabricated to have a tip radius of about 1 nm or less, about 2 nm, about 3 nm, about 4 nm, about 5 nm, about 8 nm, about 10 nm, about 12 nm, about 15 nm or more. Each field emitter element 202 in the example of FIG. 2A is configured as having a substantially cylindrical geometry having a substantially circular cross-section (in a pillar structure). In other examples, the field emitter elements can be fabricated in arrays of longitudinal structures having differing geometries, including structures having substantially rectangular, triangular, oval or other polygonal cross-section, or structures having lateral dimension that taper or otherwise vary, including tapering from base to tip (such as pyramid-shape structures).

An example system, method, and apparatus including the 1-D or 2-D array of electron sources described herein could be configured for time-multiplexed, matrix-addressed and row-scanned operation of the electron sources, as needed to transfer circuit/device patterns to a resist, resulting in high throughput.

An example system, method and apparatus according to the principles described herein can be implemented to provide high brightness field emitter arrays. To enable direct writing of features beyond the 22 nm technology node, it is desirable for the electron sources to produce electron beams of high brightness (about $10^9$ A/cm²/sr) and uniformity.

An example system, method, and apparatus herein uses an array of individually gated field emitters that can be configured and operated to produce electron beams of high brightness. In various examples, the example system, method, and apparatus herein produce electron beams of brightness about $1 \times 10^6$ A/cm²/sr, $5 \times 10^6$ A/cm²/sr, $1 \times 10^7$ A/cm²/sr, $5 \times 10^7$ A/cm²/sr, $1 \times 10^8$ A/cm²/sr, about $5 \times 10^8$ A/cm²/sr, about $1 \times 10^9$ A/cm²/sr, about $5 \times 10^9$ A/cm²/sr or greater. The high brightness affects system operation, since it can be can be used it to minimize spot size. For example, the high brightness allows an example system, method, and apparatus herein to direct write patterns with high-resolution, and with reduced time of exposure to the electron beams to write patterns for circuitry. Based on the reduced exposure times, an example system, method, and apparatus herein can be configured for high throughput pattern writing.

In a non-limiting example, the field emitter elements can be made out of silicon, germanium, carbon, a Group III-IV semiconductor system, or other semiconductor alloy system, or any combination of these semiconductor materials, or other conductive materials, as the current sources. In any of the examples described herein, the conductive material can be but is not limited to a transition metal (including a refractory metal), a noble metal, a semiconductor, a semi-metal, a metal alloy, or other conductive material. In an example, the metal or metal alloy can include but is not limited to aluminum, or a transition metal, including copper, silver, gold, platinum, zinc, nickel, titanium, chromium, or palladium, tungsten, molybdenum, or any combination thereof, and any applicable metal alloy, including alloys with carbon. In an example, the field emitter element can be a refractory metal. In an example, the conductive material can be a conductive polymer or a metamaterial. In other non-limiting example, suitable conductive materials may include a semiconductor-based conductive material, including other silicon-based conductive material, indium-tin-oxide or other transparent conductive oxide, or Group III-IV conductor (including GaAs, InP, and GaN). Other non-limiting examples of III-IV semiconductor systems or semiconductor alloy systems include but are not limited to InAs, InSb, InGaAs, AlGaAs, InGaP, AlInAs, GaAsSb, AlGaP, CdZnTe, AlGaN, or any combination thereof. The semiconductor-based conductive material can be doped. The field emitter array can be formed from an array of high aspect-ratio nanoscale systems formed from conductive or semiconductor materials, including nanoparticles, nanoshells and/or nanowires. As another example, field emitter array can be formed from an array of high aspect-ratio nanoscale systems of carbon, including single-walled and multi-walled carbon nanotubes, nanofibers, nanohorns, nanoscale heterojunction structures, graphene-based nanostructures, and carbon nanoribbons (including graphene nanoribbons and graphitic nanoribbons). In other examples, the field emitter element can include diamond, or other conductive carbon-based material. In any of the examples herein, the field emitter element can be formed from an electrically non-conductive material that includes a coating or other layer of an electrically conductive material.

In an example aspect, the field emitter tip can be formed from a portion of the field emitter element and/or can be formed from coating or otherwise layering a portion of the field emitter element with a conductive material (including any conductive material described herein).

The spatial uniformity and temporal variation of current from a field emitter array can depend on the conformation of the features in the field emitter array. As a non-limiting example, the field emitter arrays described herein can be fabricated to have a high aspect ratio of height to lateral dimension, such as but not limited to, aspect ratios of height to lateral dimension ranging from about 5:1 or more, about 10:1 or more, about 50:1 or more, about 100:1 or more, about 200:1 or more, about 500:1 or more, about 800:1 or more, about 1000:1 or more, or about 5,000:1 or more. In the example of FIG. 2A, the pillars are shown as having a height of around 10 microns. In other examples, the array can include longitudinal structures of differing heights, such as but not limited to about 0.5 microns, about 1 micron, about 5 microns, about 15 microns, about 20 microns or about 30 microns or more.

As a non-limiting example, the field emitter arrays described herein can be fabricated to provide current limiters in series, for uniformity and reliability. For example, FIG. 2A shows a plurality of silicon pillar current limiters in series, which can facilitate greater uniformity and reliability.

FIG. 2B shows magnified views of field emitter elements 202 and the field emitter tips 204 in an example Si electron emitter array. In the example of FIG. 2B, the pillars are about 20 µm in height, about 250 nm in lateral dimension and an emitter tip of about 13 nm in diameter.

In an example, an apparatus or system according to the principles herein can be configured such that a self-aligned gate made out of a conducting material is coupled to the field emitters. As a non-limiting example, each field emitter in the array can be coupled with a self-aligned gate made out of a conducting material. To operate the field emitter with low extraction voltages, the emitter tip can be fabricated to have a nano-scale tip radius, i.e., a tip radius of about 3 nm or less, about 5 nm, about 8 nm, about 10 nm, about 12 nm, or more. In an example, the field emitters also can be coupled with extraction gate apertures that are less than about 500 nm, about 300 nm, about 200 nm, about 100 nm or less, enabling the field emitter to operate at a high current using very low extraction gate voltages. The low voltage operation can have the effect of limiting the beamlet energy distribution at the wafer being exposed to less than about 1% of the total beamlet energy at 5 keV after acceleration.

Example systems, apparatus and methods according to the principles described herein can be implemented to provide field emitter and electron beam sources that include electron optics. For example, systems, apparatus and methods are described that includes electron optics hat facilitate extraction of the electrons that are supplied to a region of the field emitter array. In an example, each field emitter in the field emitter array can be disposed relative to a respective extraction gate electrode such that electrons are optimally extracted from the field emitter to form one or more electron beamlets. In another example system, groupings of two or more field emitters in the array can be coupled to a single respective extraction gate electrode such that electrons are optimally extracted from the field emitters in the grouping of two or more field emitters to form one or more electron beamlets. In yet another example two or more extraction gate electrodes can be coupled to an individual field emitter, or to a grouping of two or more field emitters, such that electrons are optimally extracted from the field emitter(s) to form one or more electron beamlets.

In various examples according to the principles herein, an extraction gate electrode may be referred to as an extractor or simply as a gate electrode.

An example system, apparatus and method herein can also include a set of electrostatic electrodes. The electrostatic electrodes could be integrated with each field emitter for the purpose of shaping, and accelerating the electron beamlets. These electrostatic electrodes can include at least one additional extraction gates and/or one or more focusing lenses, to form collimated and/or focused electron beamlets. As a non-limiting example, microfabricated Einzel lenses could be integrated with individual field emitters, or groupings of two more field emitters, to form collimated or focused beamlets. The example system, apparatus and method can also include additional microfabricated electron optical elements, such as but not limited to at least one acceleration grid and/or at least one stigmation corrector. The example system, apparatus and method can include types of electron optics to form a nano-electron optical column. In various examples, the electron optics can be electrostatic electron optics or magnetic electron optics. An example system, apparatus and method herein can be configured to act on each individual beamlets or on groups of beamlets. In the various examples herein, a beamlet could be generated by an individual field emitter, or a beamlet could be generated by a grouping of two more field emitters.

An example system, apparatus and method herein provides arrays of field emitter elements that can be regulated to switch the emission current. In an example, the emission current can be regulated by placing a current source in series with the field emitter that controls the supply of electrons to the tunneling barrier, thereby regulating the supply of electrons to individual field emitters. In an example, by regulating the emission current of individual field emitters, the currents of all of the electron beams in an array can be equalized despite field emitter tip radii variations, resulting in more uniform exposure and increased stability of the system. By placing a current source in series with the field emitters, the voltage drop across the array of emitters may no longer be uniform. In an example, a voltage divider can be formed with a fraction of the gate voltage appearing across the current source. This voltage non-uniformity can result in an increased energy distribution of emitted electrons. However the variation in turn-on voltage can be only a few volts for a small aperture due to a logarithmic dependence of operating voltage on operating current. The variation in emission voltage may be only a small percentage of the accelerating voltage. With even about 10 V variation in turn-on voltage, the variation in beam energy can be about 0.01% for 100 kV acceleration, which is well within acceptable ranges.

According to the example systems, methods and apparatus herein, the regulated current source can be implemented to allow for the control of the emission current of individual field emitters. In a first example, a logic control element (such as but not limited to a CMOS logic control chip) can be coupled to a transistor gate electrode of a vertical transistor formed from a field emitter element, to switch the transistor current source on and off, thereby providing a field emitter element that is a controlled current source. In a second example, a source of electromagnetic radiation (such as a light source) can be used to modulate the current in a reversed biased diode.

In any example according to the principles herein, the term "controlled current" refers to a component configuration that facilitates regulation of a current, including modulation, adjustment, or any other form of graduated or fine-tuned control of the current.

FIGS. 3A and 3B show example schematic diagrams of the two example field emitter arrays including the dynamic controlled current source solutions for pattern generation, according to the example systems, methods and apparatus herein. FIG. 3A shows an example schematic diagram for an example field emitter array device that includes controlled current sources in electrical communication with at least one logic control element, such as but not limited to a field emitter array integrated with controlled vertical transistors, such as controlled using a CMOS logic control chip. FIG. 3B shows an example schematic diagram for an example field emitter array device that includes optically-switched controlled current sources.

Figure 4A:
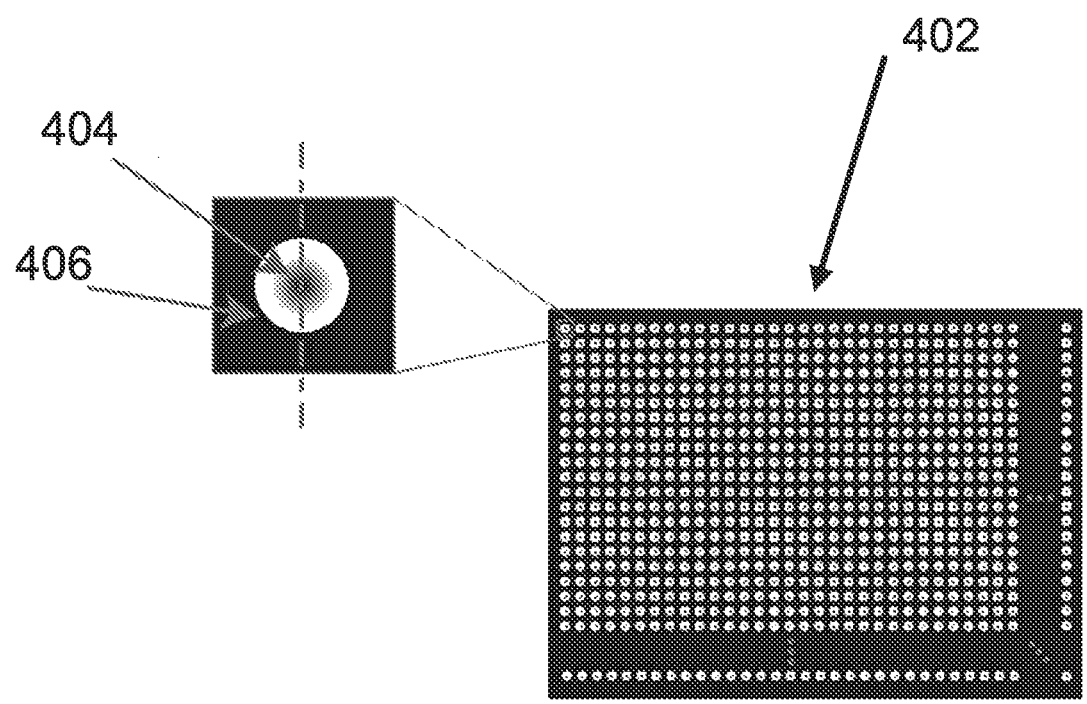
FIG. 4A shows plan and detailed views of an example field emitter array system, according to the principles described herein.
Figure 4B:
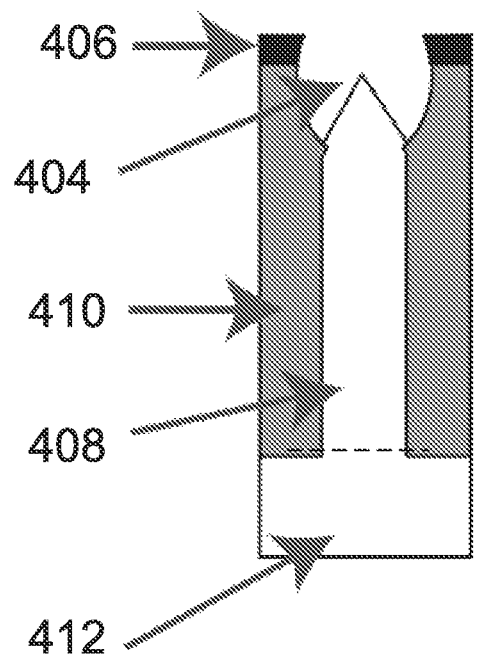
FIG. 4B shows a cross-sectional view of an example field emitter, according to the principles described herein.

FIG. 4A shows a plan view 402 of a non-limiting example system that includes an example 2-D array of field emitters. The detailed view of FIG. 4A shows a top view of a field emitter tip 404 the annular portion that forms the extraction gate electrode 406. FIG. 4B shows a cross-sectional view along the dashed line of FIG. 4A, showing an example field emitter with integrated current source and extraction gate electrode (also referred to herein as an extractor). As shown in FIG. 4B, an example field emitter of the array can be formed as a field emitter tip 404 disposed over a field emitter element 408 formed as a current source, and a extraction gate electrode 406 disposed proximate to a portion of the field emitter tip 404. As also shown in FIG. 4B, the field emitter element 408 can be disposed over a substrate 412 and proximate to an insulating material 410. In an example, substrate 412 can include electrically conductive portions, and field emitter element 408 can be disposed in electrical communication with the electrically conductive portions of substrate 412. In an example, the extractor (extraction gate electrode 406) can be implemented to extract electrons from the field emitter tip, where the electrons are supplied based on a current supplied to the field emitter element 408 acting as the current source/limiter. In the example of FIG. 4B, the extraction gate electrode 406 (as an extractor) can be formed from a metal. In other examples, the extraction gate electrode 406 can be formed from silicon or any other type of electrically conductive material, including any of the conductive materials described herein in connection with the field emitter elements. As also shown in FIG. 4B, the field emitter tip 404 can be disposed on, including being formed as an integral part of, the field emitter element 408. Each field emitter tip 404 and respective the field emitter element 408 is collectively referred to as a the field emitter element 408 of a field emitter array. As also shown in FIG. 4B, each the field emitter element 408 can be in electrical communication with a conductive substrate. The insulating material 410 can be formed form any dielectric material disposed in proximity to each field emitter element. As shown in FIG. 4B, the dielectric material can also be disposed to electrically insulate the extraction gate electrode 406 from the field emitter element 408. As shown in the detail view, the extraction gate electrode 406 can be formed as an electrically conductive layer that includes a hollow opening that is disposed over the field emitter tip 404. In various examples, the hollow opening can have any conformation, including substantially circular, polygonal, or any other symmetric or non-symmetric conformation that, with application of a field, causes the electron beamlet to emerge through the hollow opening and be directed at a target substrate to be patterned. In a non-limiting example, the hollow opening can be formed as an annular structure having an opening that is substantially concentric with a portion of the field emitter tip.

In the example of FIGS. 4A and 4B, and in any other example described herein, including in connection with FIGS. 5A to 4I, the dielectric material can include an organic material, an inorganic material, or a small molecule. In any example aspect, the organic dielectric material includes a parylene, a polyvinylphenol, a polyvinylalchohol, a polythienylene vinylene, a functionalized pentacene, a polydimethylsiloxane, or any combination thereof. In various example aspects, the inorganic dielectric material can include an oxide, a nitride, or any other dielectric form of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof. Non-limiting examples of applicable small molecules include acenes-based small molecules, thiopenes-based small molecules, fullerenes-based small molecules, phhalocyanines-based small molecules, napthalenes-based small molecules, parylene-based small molecules, quinoid-based small molecules, and/or trifluoromethylphenyl-based small molecules.

In operation of a field emitter that includes the field emitter arrays shown in FIGS. 4A and 4B, electrons are supplied to the field emitter tip via the conducting substrate. The electrons are extracted from the field emitter tip using a field applied to the extractor such that the electron beamlet emerges through the opening in the extractor and is directed at a target substrate to be patterned.

The plan view of FIG. 4A shows a substantially rectangular 2-D array 402 of the field emitter elements and extractors. In other examples, the 2-D array can be formed in any other polygonal arrangement (such as a hexagonal arrangement) or a substantially circular arrangement. In other examples, the field emitter elements and extractors can be arranged in a 1-D array or a staggered 3-D array.

FIG. 5A shows a cross-sectional view of an example field emitter array with digital control of the field emitter elements in the array. The example system of FIG. 5A includes an array of field emitters 502, each field emitter including a controlled current source 504 disposed over a substrate 510. The example system includes a number of interconnects 506 that facilitate electrical communication between the controlled current sources 504 and portions of the substrate 508. As shown in FIG. 5A, the substrate 508 can include a logic control element 510 (formed as a logic control chip in this example), and the interconnects 506 can be used to facilitate electrical communication between the controlled current sources 504 and the logic control chip. The logic control chip can be disposed in electrical communication with other conductive portions of the substrate 508 of the field emitter array. As depicted in FIG. 5A, the logic control chip can be used to cause a signal to be delivered to selectively activate individual gates of the array of field emitters 502 in an addressable manner (to be discussed in greater detail below). As shown in FIG. 5A, in an example implementation, the emitted electrons 512 in electron beams from the field emitters 502 can be directed at a resist 514 disposed over a wafer 516 that is to be subjected to further processing.

FIG. 5B shows one of the example field emitters 502 of the array, including a controlled current source 504, a field emitter tip 505 and an emitter extraction gate electrode 520. An interconnect 506 facilitates electrical communication between the controlled current source 504 and a portion of the logic control element 510. In the example of FIG. 5B, the controlled current source 504 is formed as vertical transistor that includes a field emitter element 522 and a transistor gate electrode 524. The field emitter element 522 is configured to form a source region 526 and a drain region 528 of the example vertical transistor. The example transistor gate electrode 524 substantially surrounds at least a portion of the field emitter element 522. The field emitter element 522 serves as a channel between the source region 526 and the drain region 528 of the example vertical transistor. In FIG. 5A, the example interconnects 506 are shown to be electrically couple portions of the logic control chip 510 to each of the transistor gate electrodes 524 in the array. The transistor gate electrodes 524 coupled to the field emitter element 522 of each array element can be selectively activated by the logic control element 510 to selectively control the supply of electrons from the source region 526 to the drain region 528, thereby causing each field emitter element 522 to act as a current source/limiter. Based on the selective control of each field emitter element of the array, the electrons are supplied selectively to the region of a field emitter tip 505 of an individual field emitter element or the field emitter tips 505 of a grouping of two or more field emitter elements, to selectively cause an electron beam to be directed as a surface. As also shown in FIG. 5B, a dielectric material 530 can be included to insulate the emitter extraction gate electrode 520 from the transistor gate electrode 524.

In operation, activation of a transistor gate electrode 524 based on the instructions from the logic control chip 520 creates the supply of electrons for extraction by the emitter extraction gate electrode 520 (an extractor), causing emission of an electron beamlet from the respective field emitter tip 505. In another example, an interconnect 506 may be coupled to a grouping of two or more transistor gate electrodes 524 of a grouping of two or more field emitters, to cause a supply of electrons to be provided to the field emitter tips, so that an electron beamlet from the grouping of two or more field emitters can be directed at a target substrate (shown in FIG. 5A as a wafer 516 including a resist 514) in an addressable manner. The logic control chip and the interconnects 506 are insulated from the conducting substrate of the field emitter array using a dielectric material.

FIG. 5C shows an example schematic of the control current ($I_{ctl}$) and the control voltage ($V_{ctl}$) that can be supplied to the controlled current source 504 using the logic control chip and that is used to control the current source/limiter.

In any example field emitter array herein, the field emitter element can be configured as a vertical gate field-effect transistor or as an ungated field-effect transistor. In either configuration, the field emitter element can be operated as a controlled current source according to any of the principles described herein.

Figure 6:
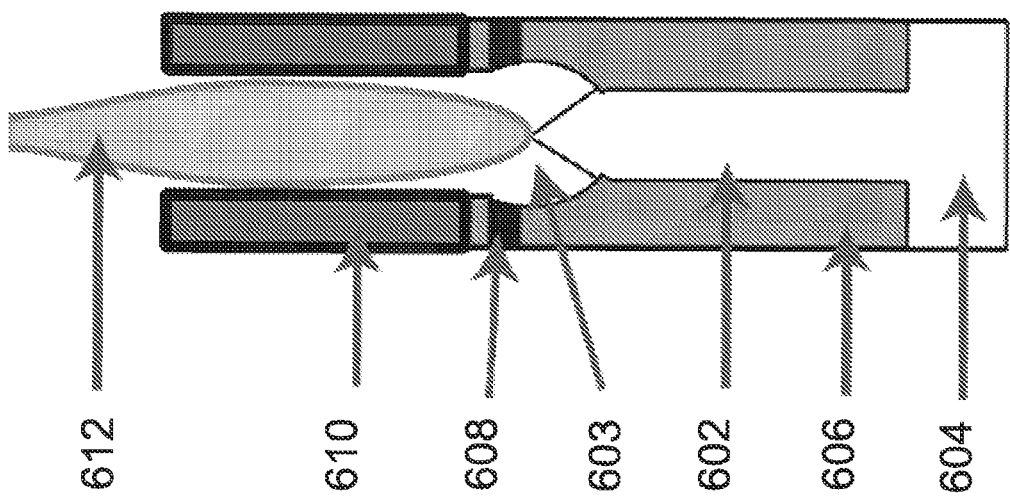
FIG. 6 shows a cross-section view of another example system that includes an example array of field emitter elements, according to the principles described herein.

FIG. 6 shows a cross-section view of another example system that includes a field emitter with integrated electron optics. The example system includes a field emitter element 602 that can be operated as a controlled current source according to any of the principles described herein. The field emitter element 602 includes field emitter tip 603 is disposed over a substrate 604 and is disposed proximate to a dielectric material 606. The dielectric material 606 electrically insulates the field emitter tip 603 from a extraction gate electrode 608 formed as a hollow opening in a conductive material layer. An electron optics assembly 610 is disposed proximate to the extraction gate electrode 608. As described herein, the electron optics assembly 610 can be used to collimate and/or focus the electron beamlet from the emitted electrons 612. The description in connection with equivalent components and materials elements of FIGS. 2A to 5C also apply to equivalent components and materials elements of FIG. 6. In an example, the substrate 604 can include or be coupled to a logic control element (such as a logic control chip) to facilitate electrical communication between the field emitter element 602 and the logic control chip. As described herein, the logic control chip can be used to cause a signal to be delivered to selectively activate controlled current sources of the individual field emitter elements 602 of the array of field emitters 502 in an addressable manner.

Figure 7:
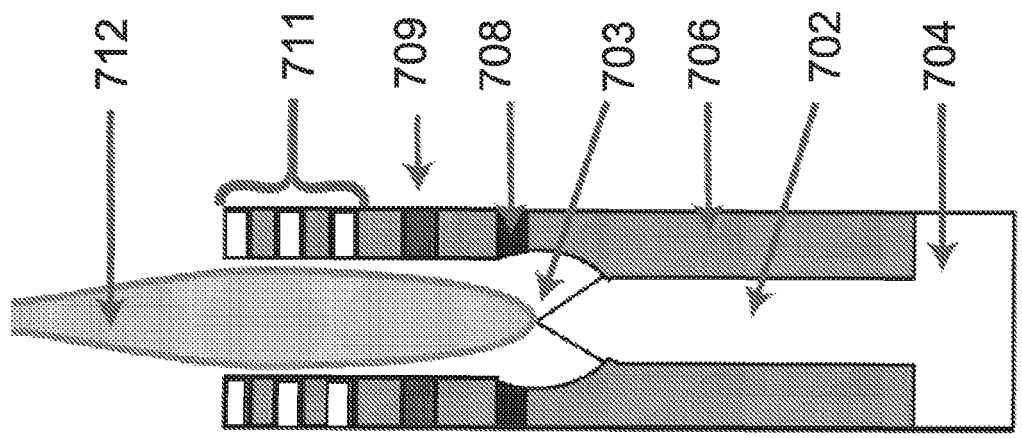
FIG. 7 shows a cross-sectional view of another example array of field emitter elements, according to the principles described herein.

FIG. 7 shows a cross-sectional view of another example field emitter element with integrated electron optics. The description in connection with equivalent components and materials elements of FIGS. 2A to 6 also apply to equivalent components and materials elements of FIG. 7. The example system includes a field emitter element 702 that can be operated as a controlled current source according to any of the principles described herein. The field emitter element 702 includes field emitter tip 703 is disposed over a substrate 704 and is disposed proximate to a dielectric material 706. The dielectric material 706 electrically insulates the field emitter tip 703 from a extraction gate electrode 708 formed as a hollow opening in a conductive material layer. The integrated electron optics includes an accelerator 709 and an integrated lens assembly 711 disposed proximate to the extraction gate electrode 708. As described herein, the electron optics can be used to collimate and/or focus the electron beamlet from the emitted electrons 712. In this example, the accelerator 709 can be implemented to modulate the energy of the emitted electrons directed at the target substrate and the integrated lens assembly 711 can be implemented to collimate and/or focus the electron beamlet. In an example, the accelerator 709 can be modulated to selectively increase or decrease the energy of an electron beamlet being emitted from the field emitter tip 703 of the field emitter element 702 such that some amount of greyscaling can be achieved in the patterning of features on the resist of the target substrate. Such greyscaling can facilitate the writing of higher resolution, more intricate patterning on the substrate than existing systems.

Figure 8:
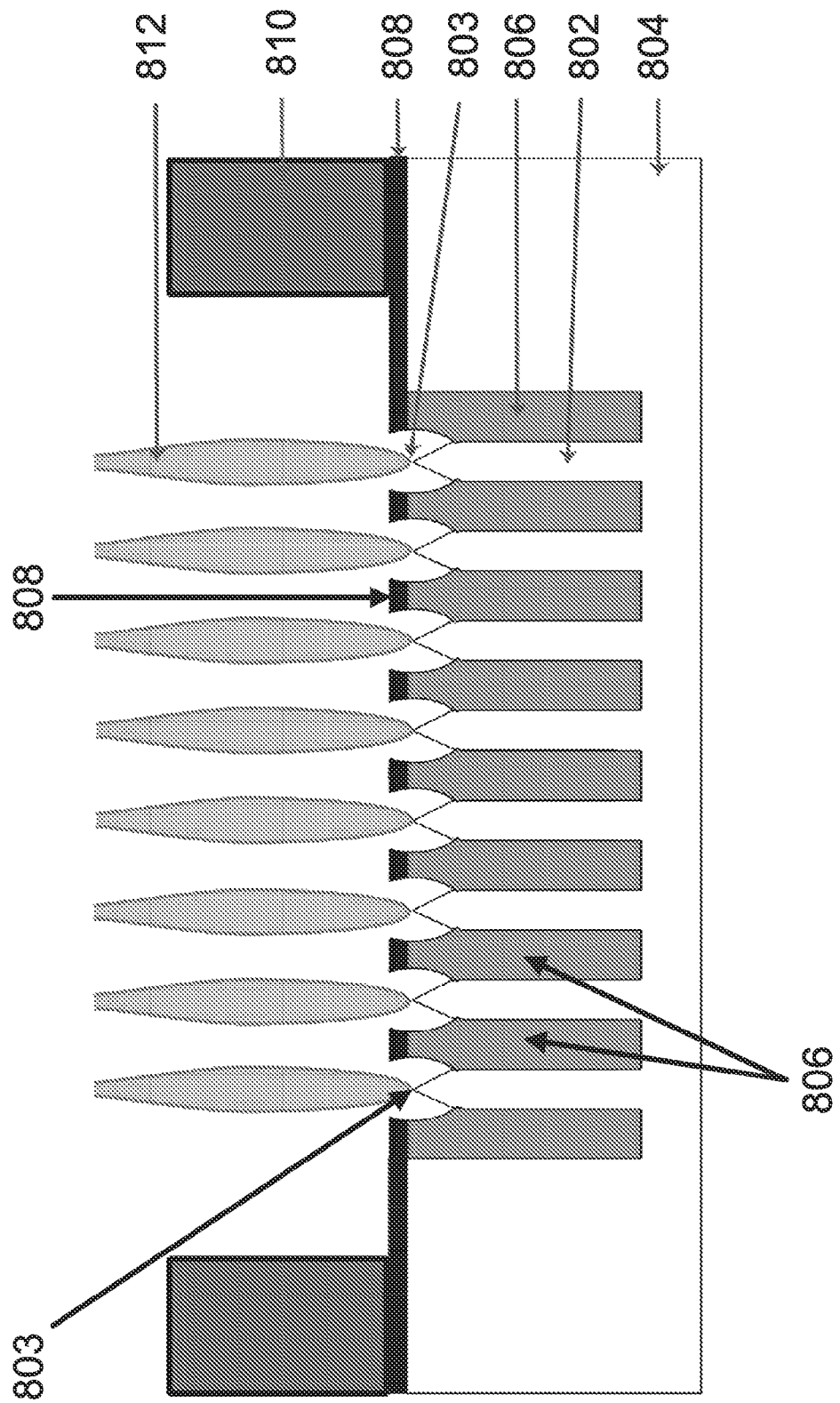
FIG. 8 shows a cross-sectional view of another example field emitter array, according to the principles described herein.

FIG. 8 shows a cross-sectional view of another example field emitter array that includes a global electron optics assembly. The description in connection with equivalent components and materials elements of FIGS. 2A to 7 also apply to equivalent components and materials elements of FIG. 8. The example system includes a number of field emitter elements 802 that can be operated as a controlled current source according to any of the principles described herein. Each field emitter element 802 includes a respective field emitter tip 803 and is disposed proximate to a dielectric material 806. The field emitter elements 802 are disposed over a substrate 804. The dielectric material 806 electrically insulates the field emitter tips 803 from a extraction gate electrode 808 formed as a hollow opening in a conductive material layer. An electron optics assembly 810 is disposed proximate to the extraction gate electrode 808. As described herein, the electron optics assembly 810 can be used to collimate and/or focus the electron beamlet from the emitted electrons 812. However, any of the electron optics described in connection with any of FIGS. 2A to 7 can be a part of the example field emitter array of FIG. 8. Each of the field emitter elements 802 that can be operated as controlled current sources according to any of the principles described herein. The global electron optics assembly 810 can include lenses. The example global electron optics assembly can be implemented to collimate and/or focus any one or more of, or substantially all of, the electron beamlets emerging from the field emitter tips 803 of the field emitter array. In an example, the global electron optics assembly 810 can be implemented to address the entire field emitter array for deflection of the electron beamlets and/or for global alignment to combat drift of the electron optics. In an example, the global electron optics assembly 810 can be selectively implemented separately from, and even concurrently, with the electron optics associated with any individual field emitter element or grouping of field emitter element, as selectively operated by the logic control chip.

Figure 9:
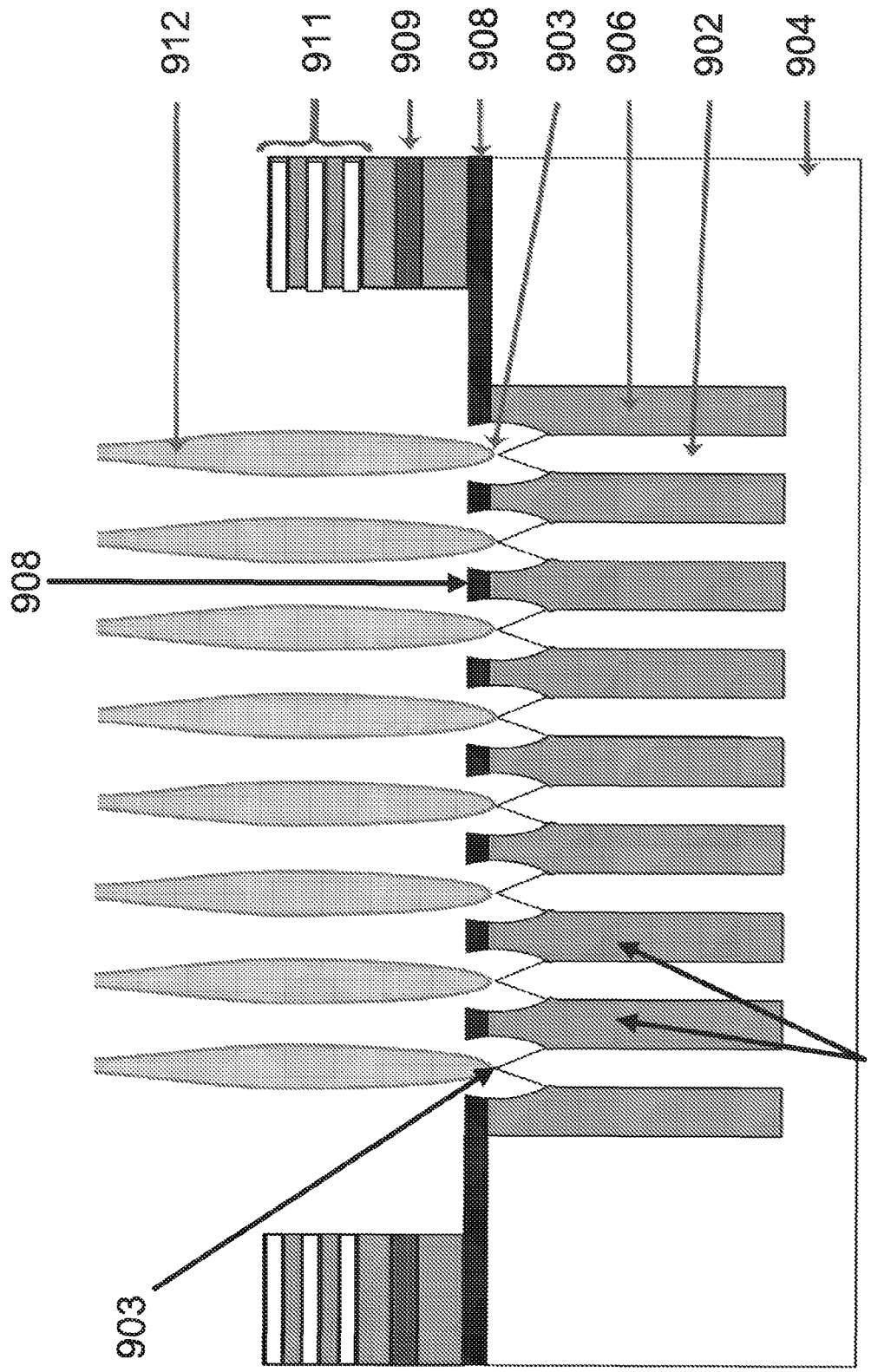
FIG. 9 shows a cross-sectional view of an example field emitter array, according to the principles described herein.

FIG. 9 shows a cross-sectional view of an example field emitter array with a global electron optics assembly that includes an integrated lens assembly and an accelerator. The description in connection with equivalent components and materials elements of FIGS. 2A to 8 also apply to equivalent components and materials elements of FIG. 9. The example system includes a number of field emitter elements 902 that can be operated as a controlled current source according to any of the principles described herein. Each field emitter element 902 includes a respective field emitter tip 903 and is disposed proximate to a dielectric material 906. The field emitter elements 902 are disposed over a substrate 904. The dielectric material 906 electrically insulates the field emitter tips 903 from a extraction gate electrode 908 formed as a hollow opening in a conductive material layer. The integrated electron optics includes an accelerator 909 and an integrated lens assembly 911 disposed proximate to the extraction gate electrode 908. As described herein, the electron optics can be used to collimate and/or focus the electron beamlet from the emitted electrons 912. In this example, the accelerator 909 can be implemented to modulate the energy of the emitted electrons directed at the target substrate and the integrated lens assembly 911 can be implemented to collimate and/or focus the electron beamlet from the emitted electrons 912. The example global electron optics assembly including the integrated lens assembly and accelerator can be implemented to collimate and/or focus any one or more of, or substantially all of, the electron beamlets emerging from the field emitter tips 903 of the field emitter array. In an example, the global electron optics assembly including the integrated lens assembly and accelerator can be implemented to address the entire field emitter array for deflection of the electron beamlets and/or for global alignment to combat drift of the electron optics. In an example, the global electron optics can be selectively implemented separately from, and even concurrently, with the electron optics associated with any individual field emitter element or grouping of field emitter element, as selectively operated by the logic control chip. In an example, the accelerator 909 can be modulated to selectively increase or decrease the energy of an electron beamlet being emitted from one or more of the field emitter tips 903 of the field emitter elements 902 such that some amount of greyscaling can be achieved in the patterning of features on the resist of the target substrate. Such greyscaling can facilitate the writing of higher resolution, more intricate patterning on the substrate than existing systems.

Figure 10:
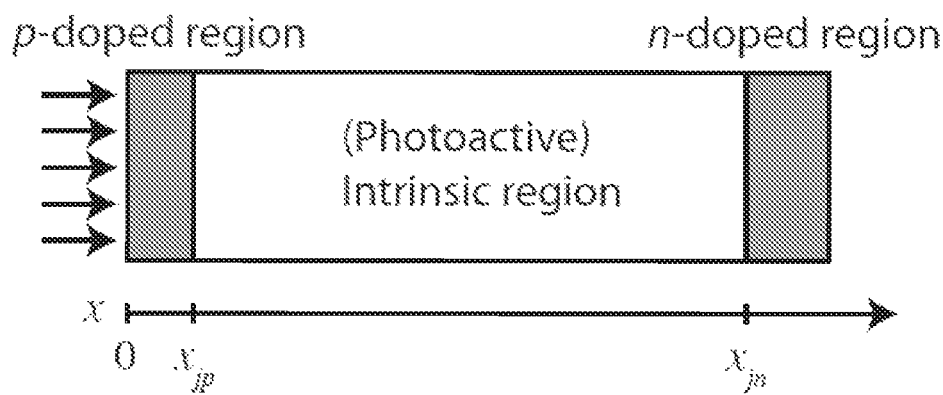
FIG. 10 shows a non-limiting example of a P-I-N diode, according to the principles described herein.

According to the example systems, methods and apparatus herein, a field emitter array device can be configured to include at least one optically switched controlled current source to provide an optically modulated field emitter array. In different examples, an optically switched controlled current source can be coupled to each field emitter element (or current source element, as applicable), or the at least one optically switched controlled current source can be coupled to two or more field emitter elements (or current source elements, as applicable). For example, to switch the example field emitter array, a P-I-N diode can be coupled to, including being integrated under, one or more field emitter elements of a field emitter array. FIG. 10 shows a non-limiting example of a P-I-N diode that includes a n-doped region, an intrinsic region, and a p-doped region. In the illustration of FIG. 10, an illumination of electromagnetic radiation is incident at the n-doped region of the example P-I-N diode. In a reverse biased P-I-N structure, a large electric field exists in the wide intrinsic region, which serves to sweep out any carriers that are generated. Electrons drift to the n-doped region of the P-I-N diode device, and, conversely, holes are swept to the p-doped region of the P-I-N diode device.

In any example implementation, the P-I-N diode can be fabricated from any semiconductor material in the art. As non-limiting examples, the P-I-N diode can be epitaxially grown, or the P-I-N diode can be fabricated by implantation of n-doped regions and p-doped regions into an intrinsic semiconductor material, either float-zone or lowly-doped, such as but not limited to a silicon wafer. The example P-I-N diode can have a well defined, narrow p-doped region to improve performance, since the absorption coefficient for silicon in the UV is approximately $10^6$ cm$^{-1}$. If a substantial fraction of the electron-hole pairs are generated in the heavily doped region, the current may be dominated by diffusion, which is a slower process, and many of the carriers may recombine before they reach the field emitter element. As a result, the responsivity of the optically modulated field emitter array device may be reduced.

For the example 1-D schematic device in FIG. 10, under an approximation where the light absorbed by the heavily doped regions does not contribute, the current density generated inside the P-I-N structure can be computed using the expression:

$$J = q(1-R)\frac{I_0 \lambda}{hc}[e^{-\alpha x_{jp}} - e^{-\alpha x_{jn}}] \qquad (1)$$

where R is the reflection coefficient, $I_0$ is the incident optical irradiance (in W/cm$^2$), $\lambda$ is the wavelength, $\alpha$ is the absorption coefficient, and $x_{jp}$ and $x_{jn}$ are the p-i and n-i junction depths, respectively. Using Eq. 1, the current density vs. wavelength can be computed for several different junction depths.

Figure 11:
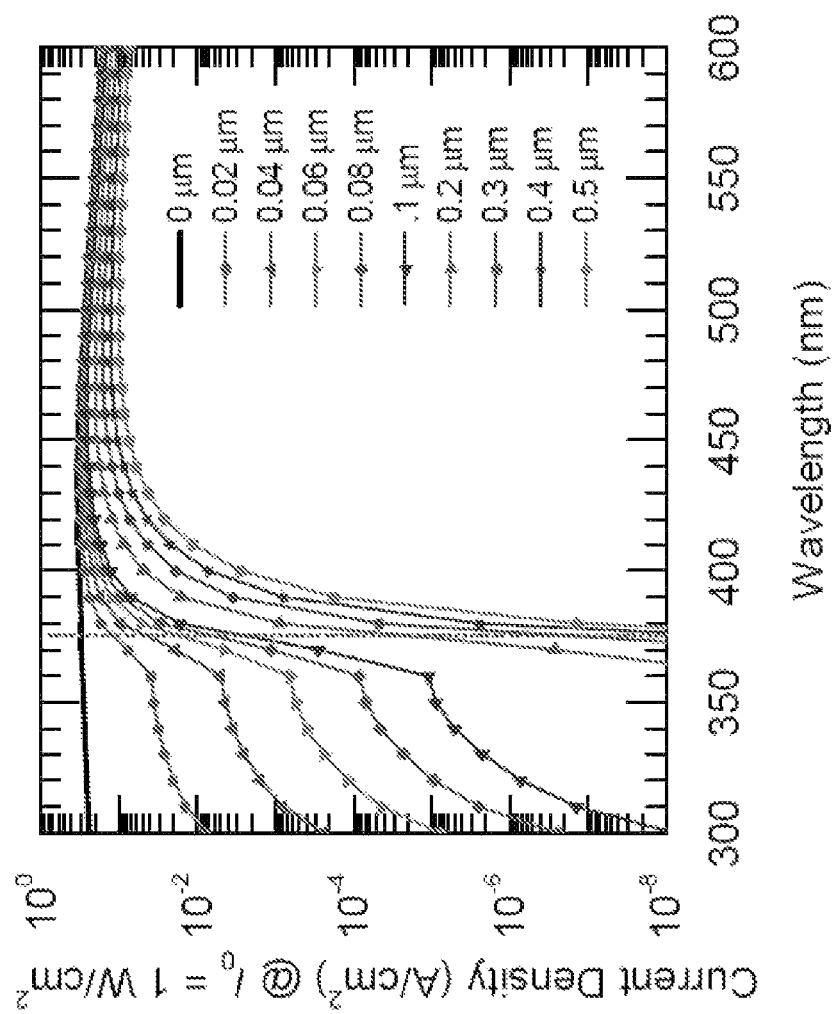
FIG. 11 shows the results of example computations of current density vs. wavelength, according to the principles described herein.

FIG. 11 shows the results of several computations of current density vs. wavelength, with reflectivity set at 0, and $x_{jn}$ fixed at 1 micron. The result illustrates the impact of the width of the p-doped implant region on obtaining photocurrent from the P-I-N diode. In an example, the p+-doped region can be configured to be as thin as possible, such as but not limited to less than about 100 nm, less than about 80 nm, less than about 50 nm, or less than about 30 nm, to enable operation at reasonable current levels with photoillumination in the near-UV. For example, in a P-I-N diode with a 50 nm wide p-doped region, assuming illumination from a UV laser diode ($\lambda$=375 nm) and a pixel size of 1 µm×1 µm, a 0.4 µW beam focused to a single pixel can generate about 10 pA of current.

Figures 12, 13:
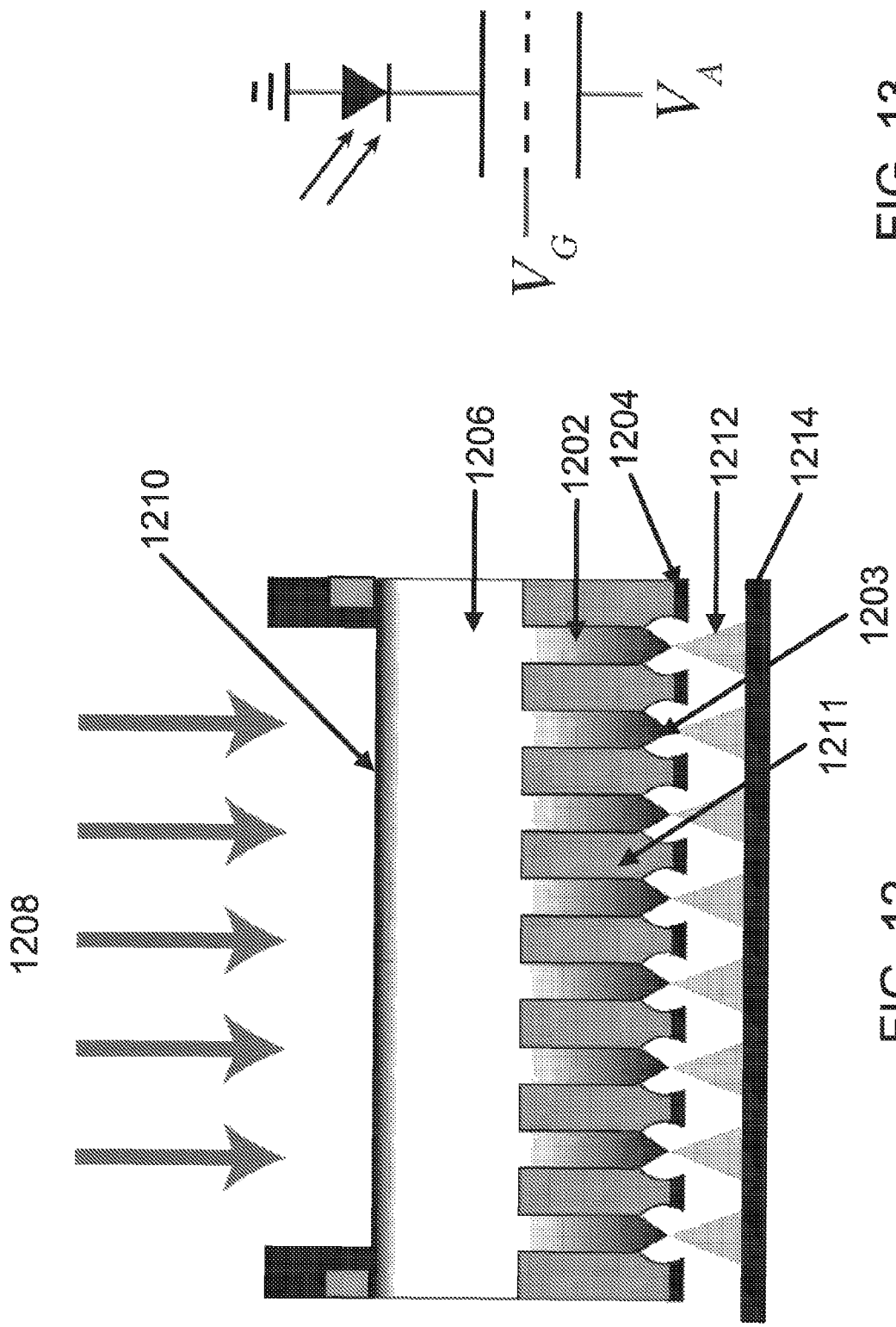
FIG. 12 shows an example field emitter array, according to the principles described herein.
FIG. 13 shows a schematic diagram of an example field emitter array, according to the principles described herein.

FIG. 12 shows an example field emitter array including a plurality of field emitter elements 1202, each with a respective field emitter tip 1203 and an emitter extraction gate electrode 1204. The example field emitter elements 1202 of the field emitter array are coupled to an optically modulated current source 1206. The optically modulated current source 1206 can be any device that can be used to provide a current under illumination of electromagnetic radiation 1208, such as at a surface 1210 of the optically modulated current source 1206. The regions proximate the field emitter elements are filled with a dielectric material 1211. In an example, the optically modulated current source 1206 can be a P-I-N diode, with the n-doped region being disposed in electrical communication with the field emitter elements and the p-doped region being disposed proximate to the surface 1210. In this example, the field emitter elements 1202 can be operated as controlled current sources, where the supply of current to the field emitter elements 1202 is controlled through the presence, absence or modulation of the illumination by the electromagnetic radiation. The emitted electrons 1212 can be accelerated by the extraction gate electrodes 1204 to a surface 1214. FIG. 13 shows a schematic diagram of the field emitter array including the P-I-N diode.

According to any of the example systems, methods and apparatus herein, the field emission array can be fabricated by isotropic etching for form the field emitter elements and subsequent oxidation to form the field emitter tips. For example, the example method can be used to form the field emitter elements and field emitter tips based on silicon. The regions proximate the field emitter elements can be filled with a dielectric material, such as but not limited to $SiO_2$. The extraction gate electrode can be formed from a n-type polycrystalline silicon. To fabricate the self-aligned gate apertures (the hollow openings) of the extraction gate electrodes, a chemical mechanical polishing (CMP) process can be used. In order to obtain a thinner field emitter device, the fabrication can be performed based on a silicon-on-insulator (SOI) substrate, and a backside window to the device layer can be formed by etching through the handle wafer to the buried oxide, such as but not limited to using a potassium hydroxide (KOH) wet etch or a deep reactive ion etching (DRIE).

Figure 14:
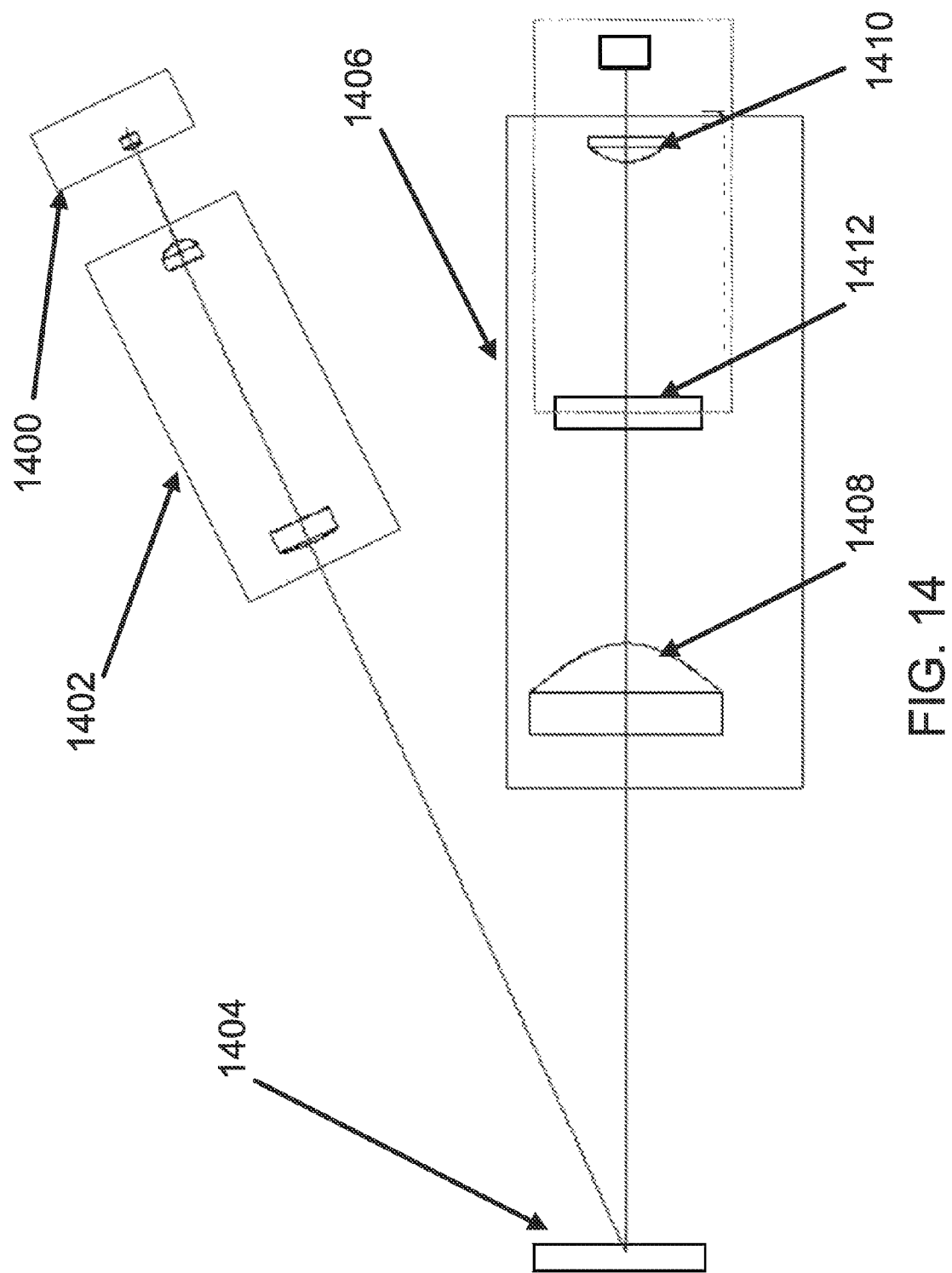
FIG. 14 shows an example optical system layout, according to the principles described herein.

FIG. 14 shows an example optical system layout that can be used to selectively illuminate discrete portions of an example optically modulated field emitter array according to the principles described herein. The example optical system includes light source 1400 (such as a laser with a collimator), a beam expander 1402, a digital micromirror device 1404, and imaging optics 1406. The imaging optics can include focusing lenses 1408 and 1410, a quartz viewport 1412. The example optical system can be implemented to take a laser beam, divide it into approximately 1.3 µm×1.3 µm pixels to address individual field emitters in the optically modulated field emitter array. The example beam expander 1402 can be used for beam shaping to collimate and expand the beam to fill the digital micromirror device (DMD) 1404. The example beam expander 1402 expands the collimated output of the diode laser (such as but not limited to with cone half-angle of 20 degrees) from about 4 mm diameter to about 15 mm, thereby providing a wide, flat illumination field. An example DMD device 1404 can include an array of micromirrors that can be individually actuated at a range of angles of about +/−12 degrees to either reflect the beam into the imaging path of the field emitter array or a beam stop. The example device of FIG. 14 can be used to perform the selective addressing of the individual optically modulated field emitters of an example field emitter array. In a non-limiting example, each micromirror can be configured to address one or more field emitter elements of an example field emitter array. The image from the example DMD 1404 can be reduced a factor of about 10× by the imaging optics, and the field emission array device is placed in the focal plane of the imaging optics.

Figures 15, 16:
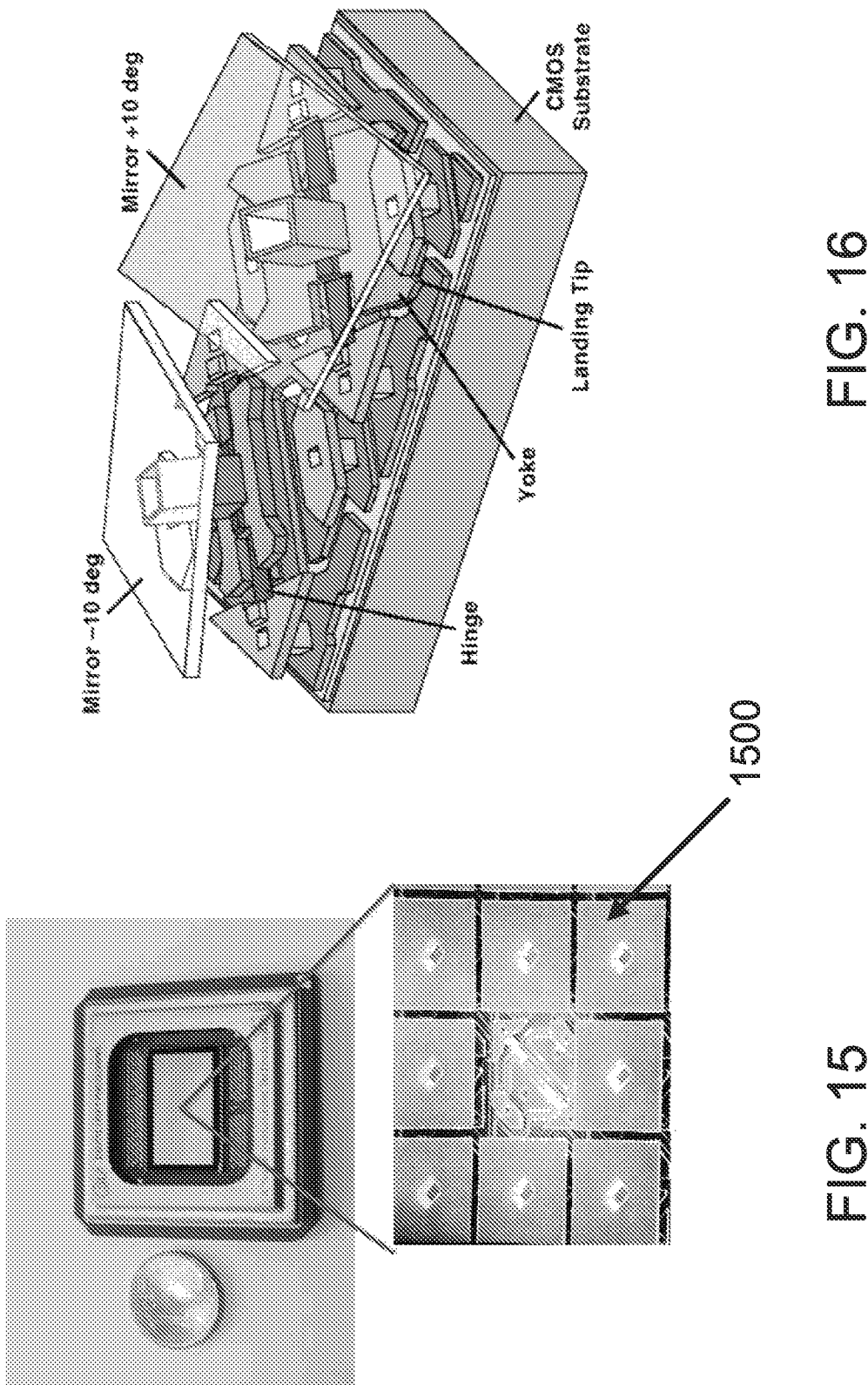
FIG. 15 show an example digital micromirror device (DMD), according to the principles described herein.
FIG. 16 shows example components of an example DMD, according to the principles described herein.

FIG. 15 show a non-limiting example of a DMD device, including a plurality of micromirrors 1500, such as but not limited to a DLP3000 Digital Micromirror Device and accompanying DLPC300 Digital Controller by Texas Instruments Inc. (Dallas, Tex.).

Figure 17:
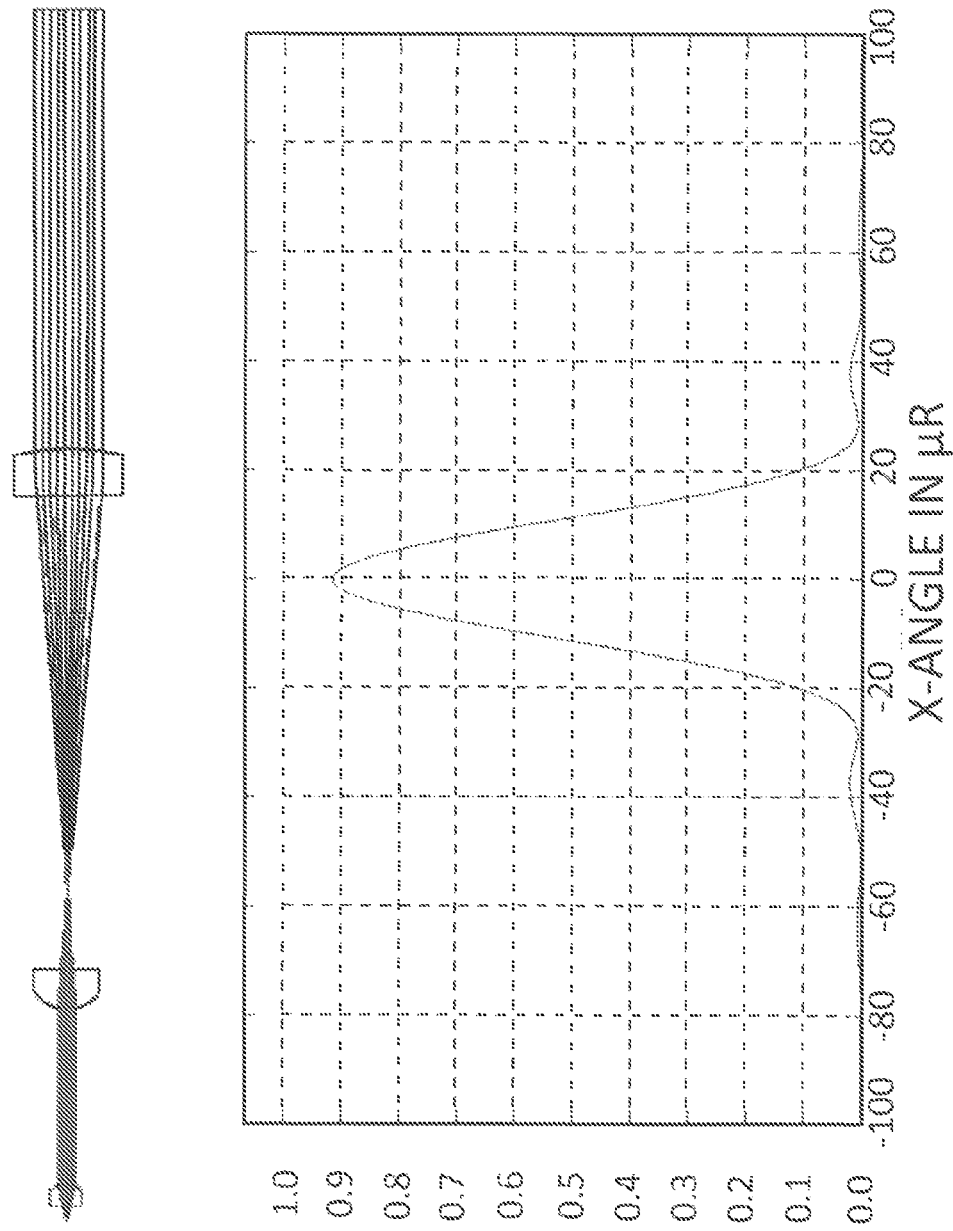
FIG. 17 shows a plot of an example beam expander output, according to the principles described herein.
Figure 18B:
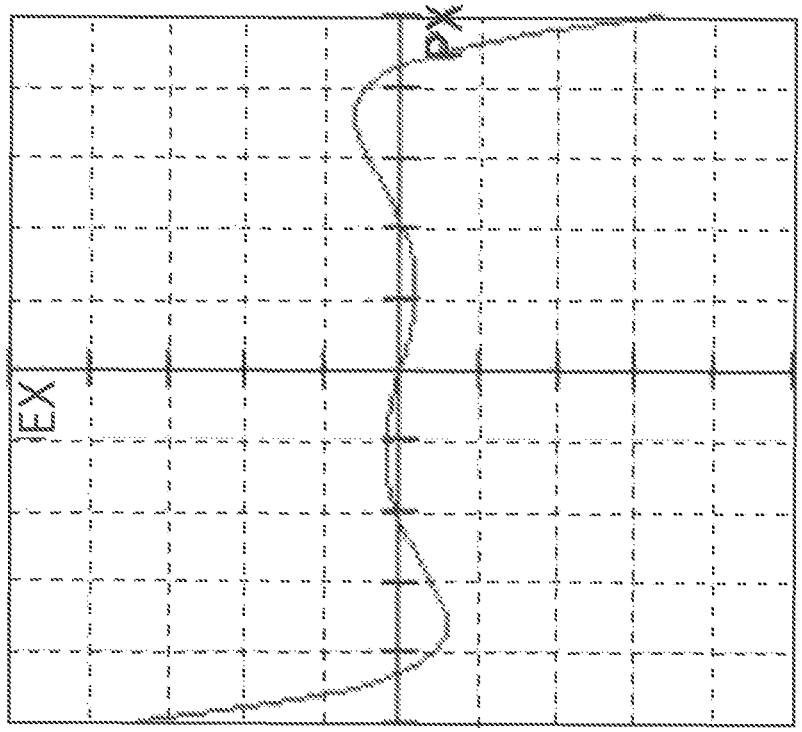
FIGS. 18A and 18B show plots of an example beam expander ray fan, according to the principles described herein.
Figure 18A:
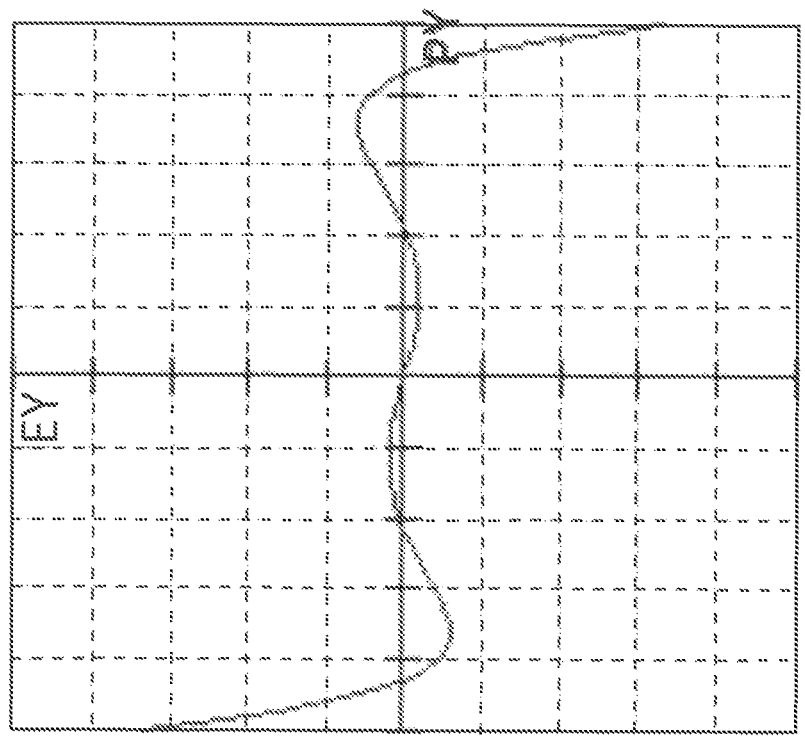
Figure 20:
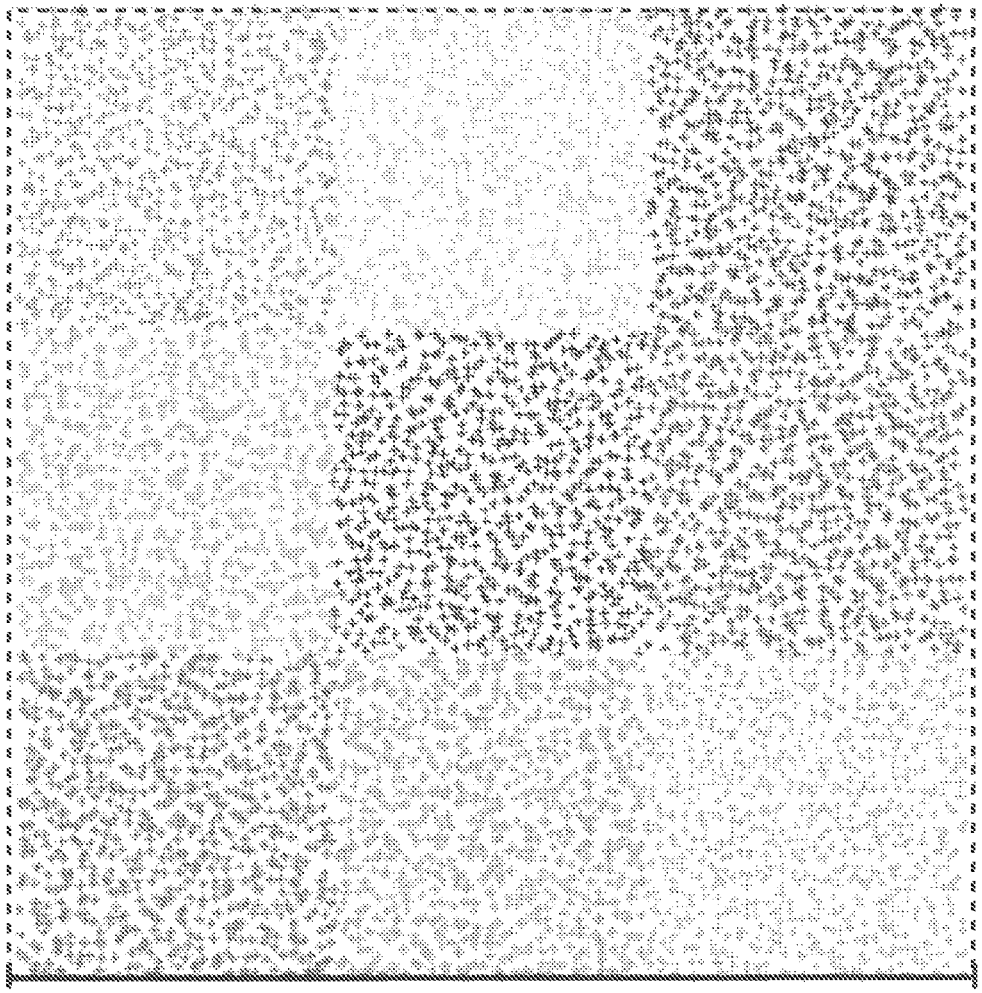
FIG. 20 shows an example of the simulated imaging of nine (9) pixels of an example DMD, according to the principles described herein.
Figures 21A, 21B:
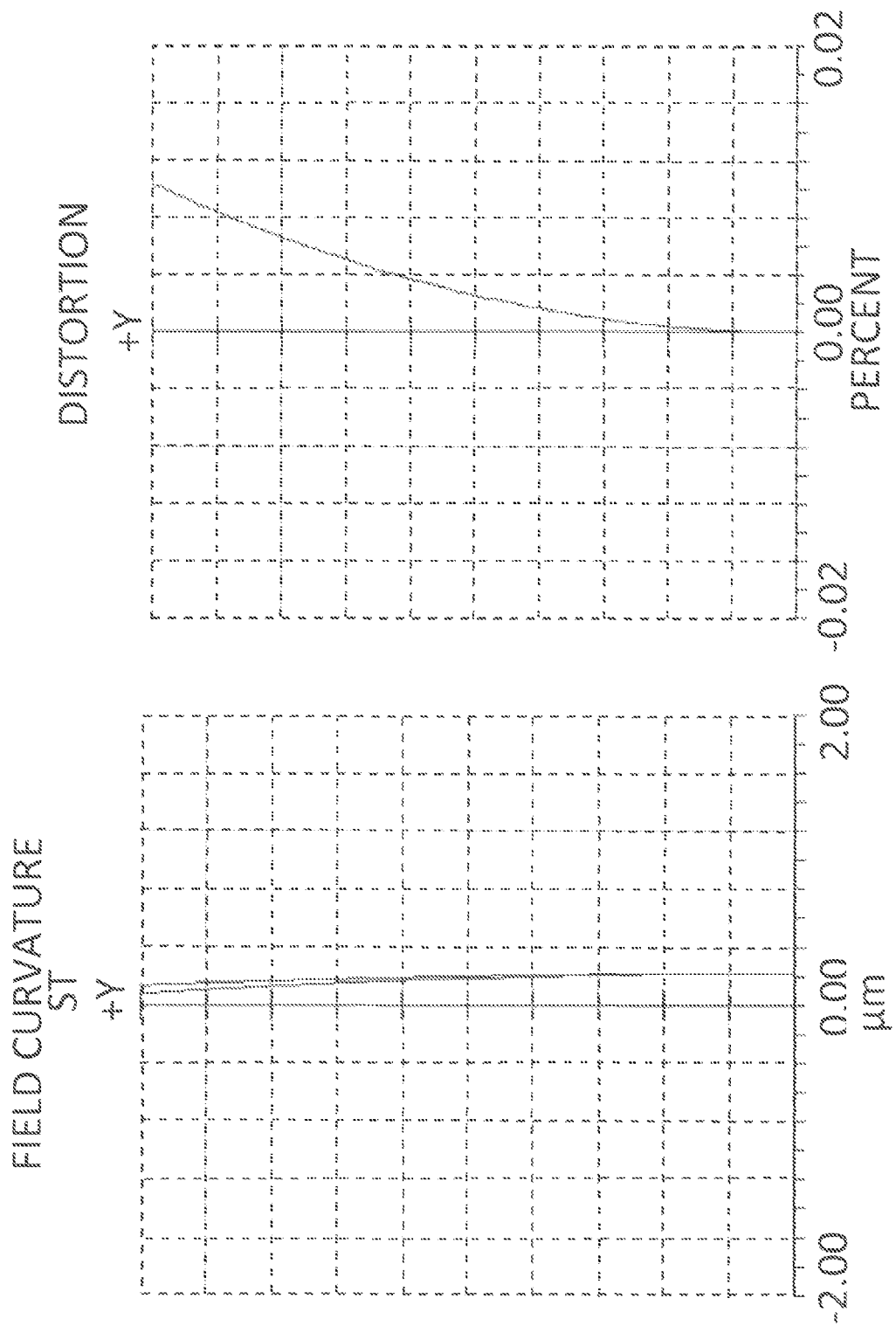
FIGS. 21A and 21B show plots of the field curvature as a function of diameter of an example beam expander, according to the principles described herein.

FIG. 16 shows example components of a DMD (such as available from Texas Instruments Inc.), including the micromirrors and the mount for each micromirror, which includes a hinge, a yoke, and a landing tip. The micromirrors are coupled to integrated circuitry of a CMOS substrate to operate the mount for each micromirror. FIG. 17 shows a plot of an example beam expander output, showing the beam divergence point spread function. The top panel of FIG. 17 shows the operation of an example beam expander. FIGS. 18A and 18B show plots of an example beam expander ray fan, to provide a measure of aberration. FIGS. 19A and 19B show examples of the spot size from the imaging optics at 0 mm and 1 mm. FIG. 20 shows an example of the simulated imaging of nine (9) pixels of the example DMD onto an example device. FIGS. 21A and 21B show plots of the field curvature as a function of diameter in microns and distortion as a function of percentage of the beam expander.

Figure 22:
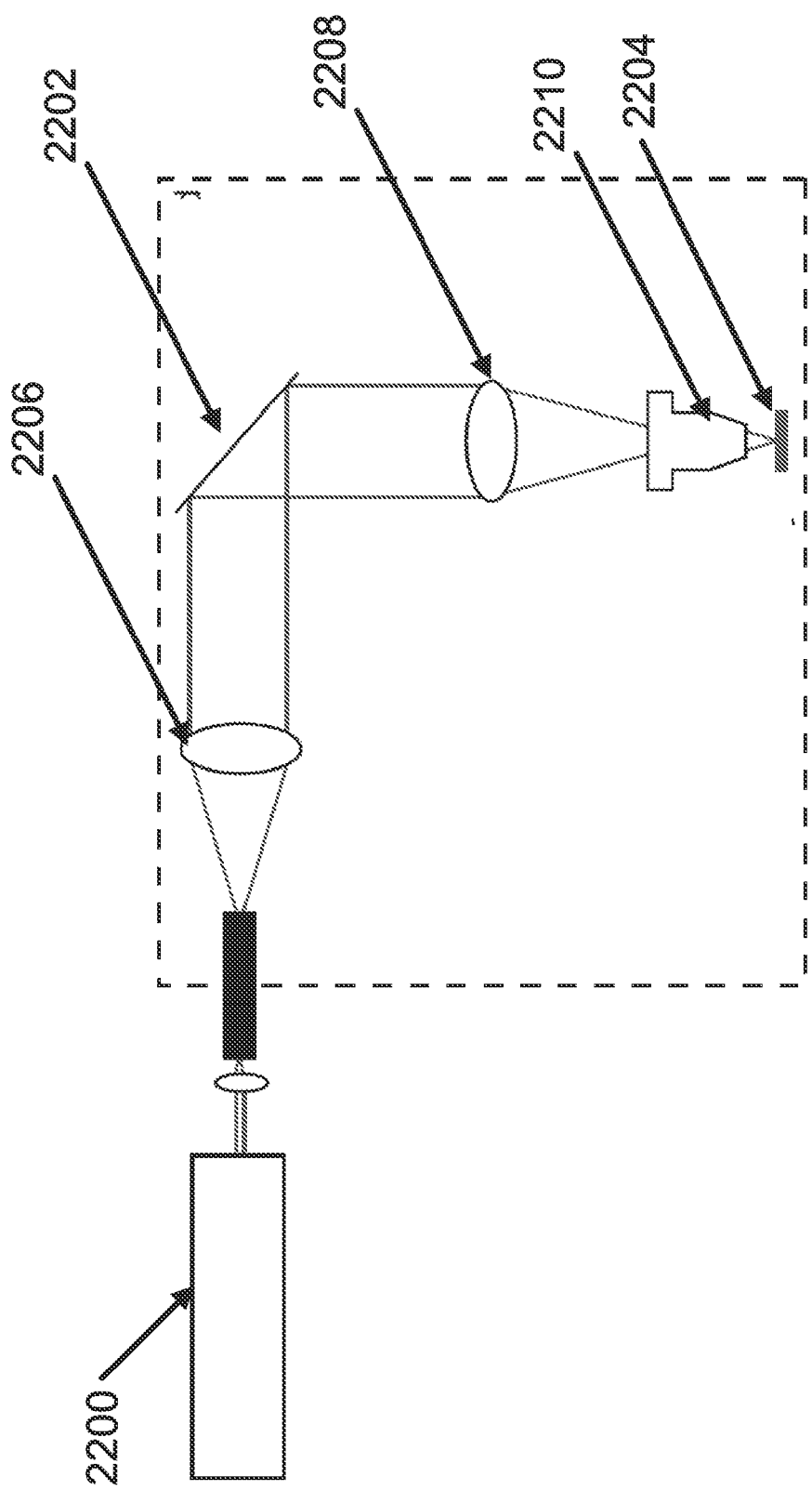
FIG. 22 shows another example optical system layout, according to the principles described herein.

FIG. 22 shows another example optical system layout that can be used to selectively illuminate discrete portions of an example optically modulated field emitter array according to the principles described herein. The example optical system includes a UV laser 2202 (such as but not limited to a 375 nm CW laser) to illuminate a digital micro mirror device (DMD) 2202, which is subsequently imaged on to the back side of the example field emission array 2204 using a number of optics. The example optics include a collimation lens 2206, a relay lens 2208, and an objective lens 2210. The example DMD is a computer controlled micromirror array that reflects light at a range of angles of about +/−12 degrees depending on the voltage applied. The example DMD supports display resolutions up to 1920×1080 at pattern rates of up to about 32 kHz. The example DMDs include UV transparent glass and antireflective coatings to transmit a very high percentage of UV radiation. The example DMD can be configured to have a pixel pitch of between 8 µm and 13 µm. The example optics can be optimized accordingly.

Any example field emitter array according to the principles described herein can be implemented to expose a resist on a surface. In a non-limiting example, the resist can be a polymethylmethacrylate (PMMA) resist. In other examples, other resist materials used in the art are applicable. The dose to expose the PMMA resist can vary as a function of patterned area, beam energy, and development conditions. In an example, the electrons of the field emitter beam serve to break the carbon backbone of the PMMA polymer into smaller fragments (scission events) that are more soluble in a developer. For PMMA, a 1:3 ratio of MIPK:IPA can be used for developing high-resolution features. Cooling the developer bath below 0° C. can facilitate contrast enhancement. As a non-limiting example, a dose range of about 50 µC/cm$^2$ to about 100 µC/cm$^2$ can be used for sub-100 nm features with a 10 kV electron beam and 65 nm thick PMMA. As a non-limiting example, a dose of about 100 µC/cm$^2$ can be used and each electron beamlet can be configured to address a 50 nm pixel, where each beamlet deliver about 1.69 fC to the wafer. In another example, with about 10 pA of current/beamlet, the dwell time can be about 196 µs. In another example, for the upper bound, the electron beamlet can be de-focused to cover a 1 micron pixel, and about 785 fC of charge can be delivered by each beamlet, with a dwell time increasing accordingly to about 80 ms.

In a non-limiting example, a field emitter array according to the principles described herein can be fabricated with a self-aligned gate electrode as an extraction gate electrode, with each field emitter in the array being individually ballasted by a vertical ungated field effect transistor. An example field emitter array device according to the principles described herein can be configured to provide a current of about 10 pA/emitter and have 1M field emitters in the example array. The example field emitter array device according to the principles described herein can be configured to provide a uniform current across the field emitter array and operate at a low extraction gate electrode extraction voltage. In an example, the gaps between adjacent high-aspect-ratio vertical ungated field-effect transistors that form the field emitter elements (In an example, the pillars) can be filled using any dielectric material. In an example, changing the packing of the field emitter elements from square packing to hexagonal packing facilitates improved filling with a dielectric material.

In another non-limiting example, a field emitter array according to the principles described herein can be configured as a two dimensional array of closely packed electron sources (field emitter elements) based on scaled field emission arrays that are individually ballasted by high aspect ratio silicon current limiters. The gated field emitter elements of the field emitter arrays can be configured to have about a 1 µm pitch and can be ballasted by about 100 nm diameter, about 10 mm tall silicon pillars formed as ungated vertical field-effect transistors. The example field emitter array device can be based on high-aspect-ratio silicon pillar current limiters (vertical ungated field-effect transistors) for ballasting individual field emitters within field emitter arrays. Dense (1 µm pitch) field emitter arrays that are individually ballasted by 100 nm diameter and 10 µm tall ungated field-effect transistors can be fabricated with field emitter tip radii under around 10 nm. When the vertical ungated field-effect transistors are incorporated into large arrays of field emitters, the current-voltage characteristics of the field emitter arrays can exhibit current limitation at high extraction gate voltages. Emission current densities of over 200 µA/cm$^2$ can be obtained from 1.36 million emitter arrays with about 5 µm pitch. The current by the field emitter arrays including the field emitter elements (the pillars) configured as field effect transistors can be about 14.7 pA per pillar at saturation, which is desirable for a dynamic pattern generator.

In another non-limiting example, a field emitter array according to the principles described herein can be configured as a two dimensional array of closely packed electron sources based on scaled field emission arrays that are individually ballasted by vertical silicon metal-oxide-semiconductor field-effect transistors (MOSFETs). In this example, the silicon columns can have a smaller aspect ratio, thereby simplifying the fabrication process. The example gated field emitter arrays can have about a 1 µm pitch and can be ballasted by vertical 100 nm diameter silicon MOSFETs.

An example system, method and apparatus according to the principles described herein are configured with selectively addressable field emitter elements, and can be selectively activated.

To switch the individual field emitter elements on and off, the gate voltage of the field emitter could be modulated using a voltage source, or the emitter current of the field emitter could be modulated using a controlled current source that is connected in series to each field emitter.

Using the controlled current source has the added benefit that it further reduces the variation in electron beamlet current across the array and enhances current stability by controlling the supply of electrons to individual emitters. The current source that is used to control the emitter current could be addressed by a voltage source (e.g., a voltage controlled current source), a current source (e.g., a current mirror), and/or with an optically modulated current source (e.g., an optical beam impinging on a P-I-N photodiode), as described herein above.

As described hereinabove, the field emitter array can be arranged, and controlled by an example logic control chip, to function as separately addressable elements. In an example, the system or apparatus can be configured as including one or more arrays of field emitter elements, each field emitter array being coupled with its individual logic control chip, or all being controlled by a single logic control chip.

Figure 23:
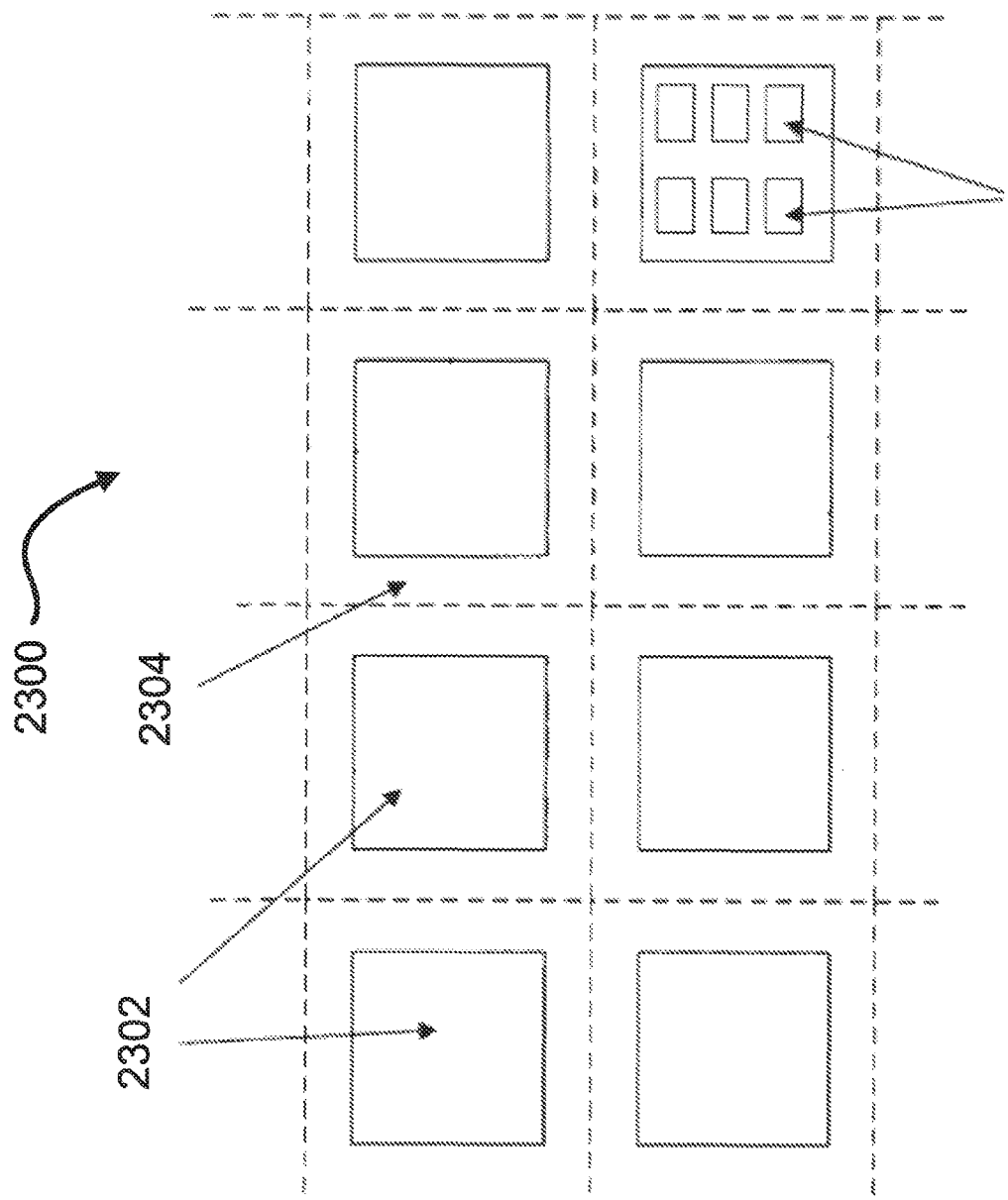
FIG. 23 shows an example system formed from one or more field emitter array regions, according to the principles described herein.

FIG. 23 shows a non-limiting example system 2300 that can be formed from one or more field emitter array regions, each array region 2302 including an array of field emitter. Each field emitter element of an example field emitter array can be formed as any of the examples described herein. FIG. 23 shows a non-limiting example of an arrangement of field emitter arrays 2306 that are included in a field emitter array region. The system may also include regions 804 that do not include field emitter elements. In an example implementation, field emitter regions 2302 can be formed as discrete pattern writing regions of a direct write patterning e-beam photolithography system.

An example system, method and apparatus according to the principles described herein are configured with control and logic capabilities. In an example, the field emitter array can be controlled using a logical shift register of the logic chip. The shift register facilitates a pattern of "on" and "off" pixels to be stored on the logic chip.

In an example, to make contact between the logic chip and the electron gun, 3-D integration techniques such as through-silicon vias (TSVs) or micro-bump bonds, can be used to transfer the signals between the chips. The control and logic can be implemented using any of the control logic chips described in any of the examples herein.

An example system, method and apparatus according to the principles described herein facilitates pattern writing. The control and logic can be applied to cause a system including any of the field emitter arrays described herein to cause a pattern to be written on a substrate. The control and logic orchestrates the writing process, and mechanical components of the system can be controlled to scroll the field emitter arrays across a substrate to write the desired pattern. In an example, the pattern can be written similarly to a dot matrix pattern. In an example, each row of a field emitter array can be selectively addressed at a time and the system is scrolled across the substrate in columns.

The separately-addressable gating region can be actuated to write a pattern using matrix addressing, such as addressing each column or addressing each row. In an example, each extraction gate electrode can be scrolled one at a time or a number of extraction gate electrodes can be scrolled at substantially the same time. In an example, the pattern writing can be performed through row addressing or column matrix addressing.

The field emitter arrays herein can be used to implement grey leveling to write small features. In an example, each field emitter element, or each field emitter array, can be controlled and modulated to deliver electron beamlets of differing energy to the substrate during a given time period, such that each electron beamlet writes a feature of differing levels of contrast or thickness, thereby achieving the grey-scaling. In another example, the electron beamlet emission from each field emitter, or each field emitter array, can be maintained at substantially the same emission pattern, however the resident time for exposure of each feature in the pattern can be varied so that the system writes a feature of differing levels of contrast or thickness in the pattern, thereby achieving the greyscaling.

Non-limiting example processes for fabrication of the field-emitter element arrays according to the principles described herein are described. The fabrication process includes a technique for filling the spaces or voids between the high aspect ratio field emitter elements with the respective field emitter tips. In the non-limiting examples described, the field emitter elements are fabricated as silicon pillars with tips. However, the disclosure encompasses processes for fabricating any of the high aspect-ratio field emitter elements according to any of the systems, methods and apparatus described herein.

A non-limiting process for fabricating the field emitter elements is based on poly-silicon deposition and its oxidation to fill the gap between the silicon pillars. For example, the oxidation of poly-silicon (e.g., about 10 nm of poly-silicon) can be used for the formation of about 22 nm of silicon dioxide. This is followed by silicon nitride deposition and its removal using a chemical mechanical polishing (CMP) (for a non-selective etch) and a hot phosphoric acid {for a selective etch}. In an example, high temperature low pressure chemical vapor deposition processes can be employed. In an example, the fabrication processes can be configured to prevent or reduce gas phase precipitation and encourage high surface mobility. The example fabrication process can be controlled by reaction rate at the gas/solid interface as opposed to reactant species transport to the interface.

An example fabrication process according to the principles described herein facilitates the addition of a self-aligned gate to the high aspect ratio field emitter elements (such as silicon tips on silicon post). The example fabrication process includes the ability to selectively remove silicon nitride through chemical mechanical polishing and hot phosphoric acid etch and the ability to remove poly-silicon through chemical mechanical polishing.

Figure 24:
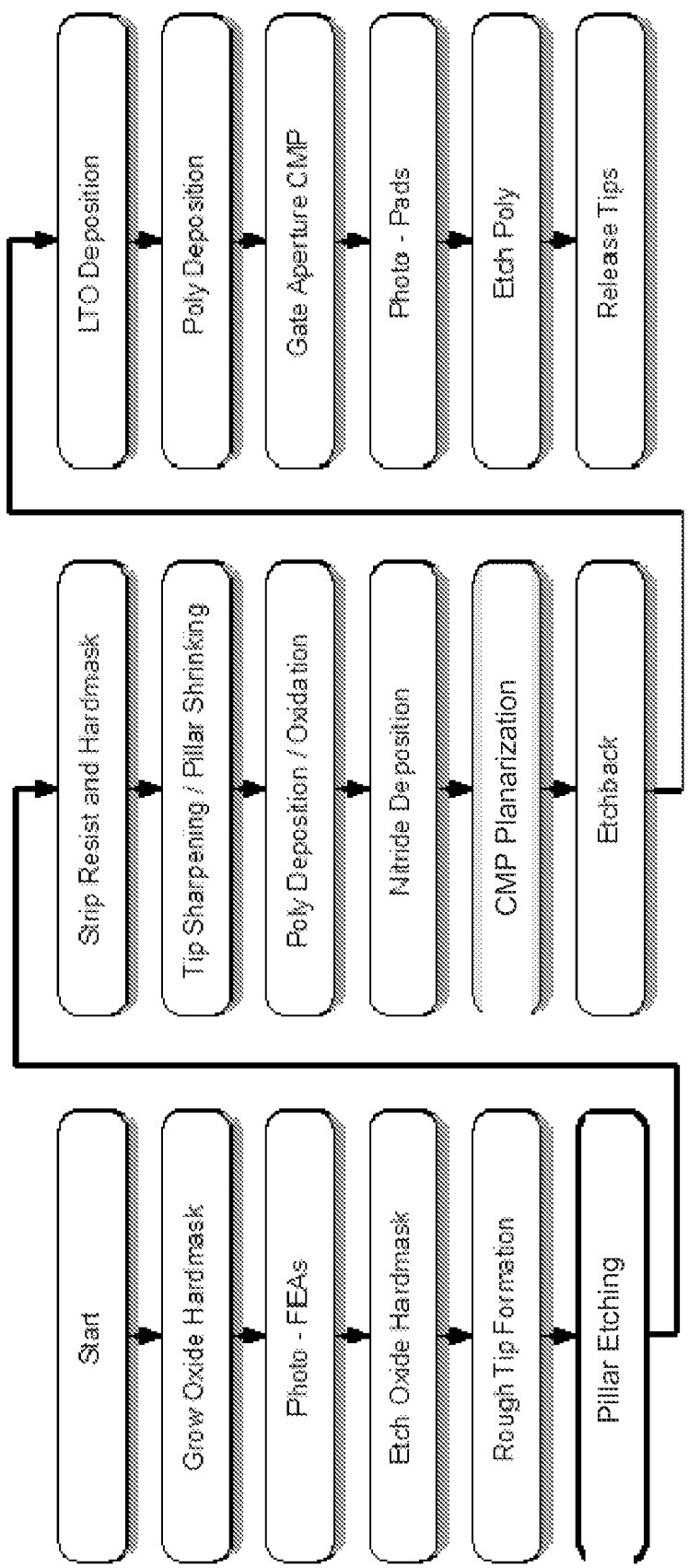
FIG. 24 shows an example fabrication process for generating the field emitter arrays, according to the principles described herein.

FIG. 24 shows procedures for a non-limiting example fabrication process for generating the field emitter arrays including the high aspect ratio field emitter elements. The non-limiting example fabrication process includes procedures for rough tip formation using high pressure plasma etch followed by a deep reactive ion step to create the high aspect ratio silicon columns. After the removal of the photoresist and the oxide mask, an oxidation sharpening is performed. The scanning electron microscope (SEM) image in FIG. 2A shows a 2000×2000 array of silicon field emitters based on 10 micron tall high aspect ratio silicon columns with nanoscale tips, fabricated according to this procedure. The example array has 1 micron pitch, and the inset of FIG. 2A shows a field emitter tip in the array that has tip radius less than about 10 nm. Poly-silicon is next deposited and the poly-silicon layer is then fully oxidized to consume substantially all of the poly-silicon deposited previously. Oxidation results in volume expansion, which results in the filling-in of the gap between the silicon columns. A plasma enhanced chemical vapor deposition of a silicon nitride layer is performed.

Figure 25:
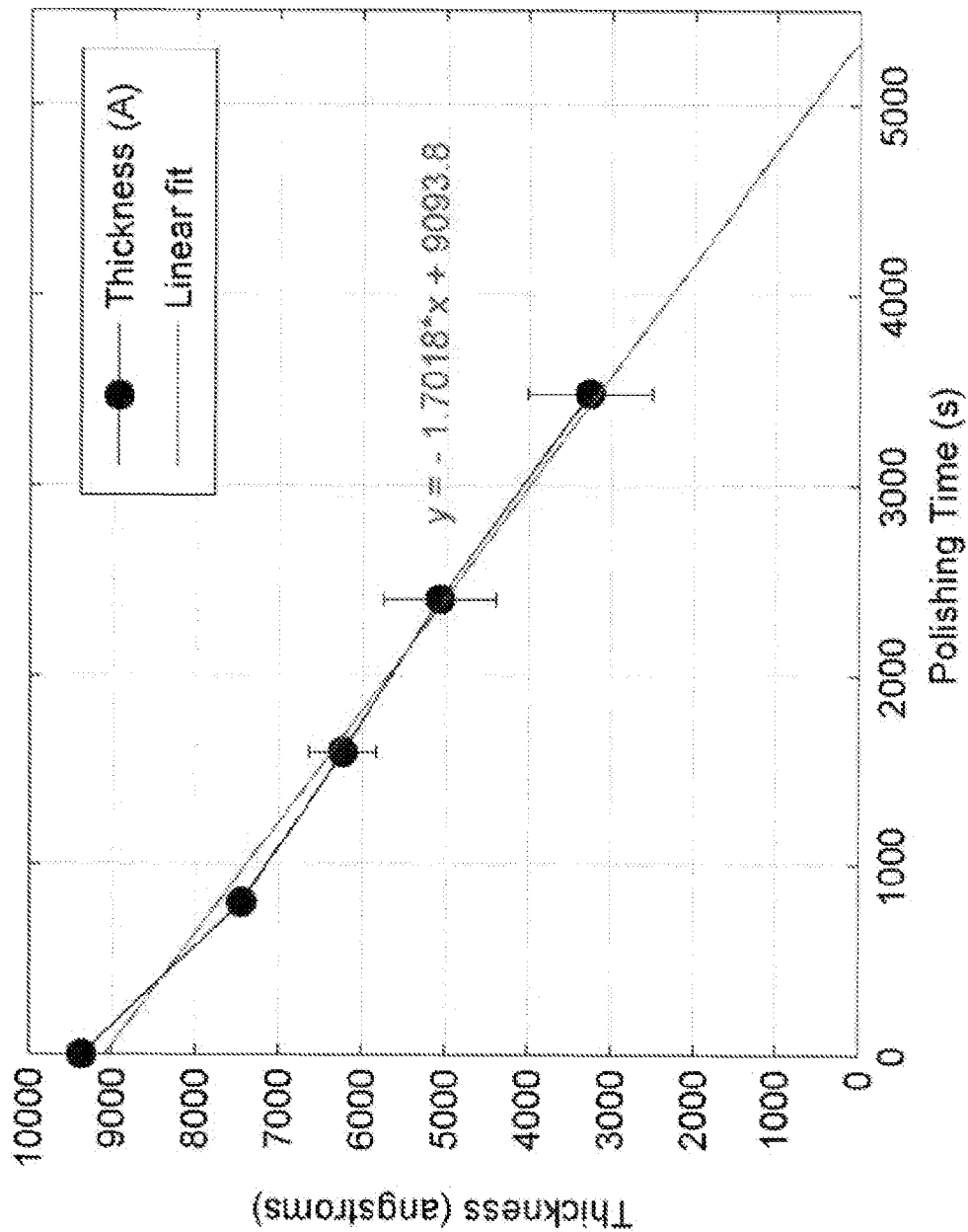
FIG. 25 shows the results of measurements of the thickness vs. polishing time for the CMP polishing rate of silicon nitride, according to the principles described herein.

The wafer surface is next planarized using a chemical mechanical polishing (CMP) process. The CMP of the silicon nitride is characterized according to the polishing rate of silicon nitride. FIG. 25 shows the results of measurements of the thickness vs. polishing time for the CMP polishing rate of silicon nitride, showing that the polishing rate is about 10 nm/min. This is in contrast to a polish rate of about 50 nm/min for silicon dioxide. The planarized silicon nitride is removed using a hot phosphoric etch back process, and acts in essence as a continuation of the planarization process. Hot phosphoric selectively etches silicon nitride with respect to other materials such as silicon and silicon dioxide. This step exposes all the oxide domes that are covering the silicon field emitter tips.

Figure 26:
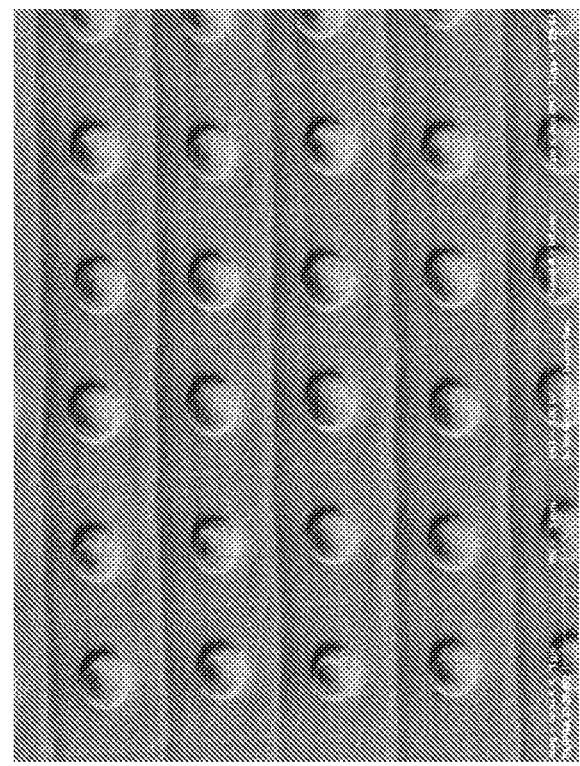
FIG. 26 shows a SEM image of domes of silicon dioxide, according to the principles described herein.

FIG. 26 shows a SEM image of domes of silicon dioxide prior to the deposition a low temperature oxide and the poly-silicon gate layer. The oxide domes are formed after the selective etch of the silicon nitride after polishing to planarize wafers. The SEM image shows that the gaps are completely closed. A scanning atomic microscope analysis shows that the domes are at least about 200 nm in height (i.e., about 200 nm higher than the background plane). The poly-silicon gate is polished and the oxide layer deposited using a low temperature process.

Figure 27:
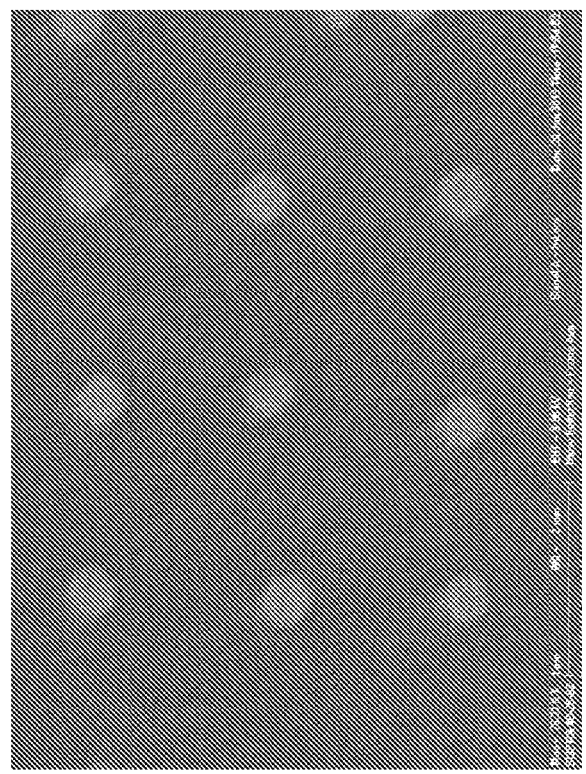
FIG. 27 shows a SEM image of the polished poly-silicon layer, according to the principles described herein.

FIG. 27 shows a SEM image of the polished poly-silicon layer. The bright spots correspond to the exposed silicon dioxide layer after the poly-silicon bump has been leveled. The tips are then exposed with buffered oxide etch.

Figure 29:
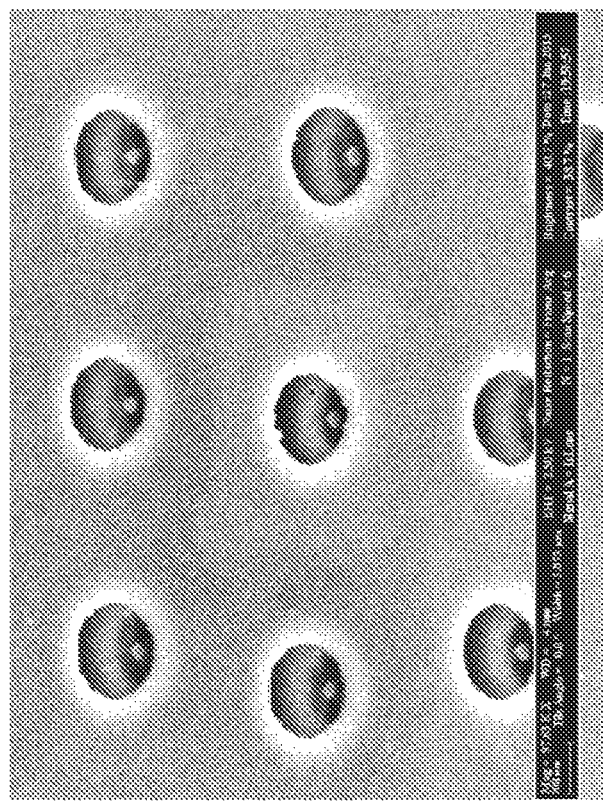
FIGS. 28, 29 and 30 show SEM images of the released field emitter tips, according to the principles described herein.
Figure 28:
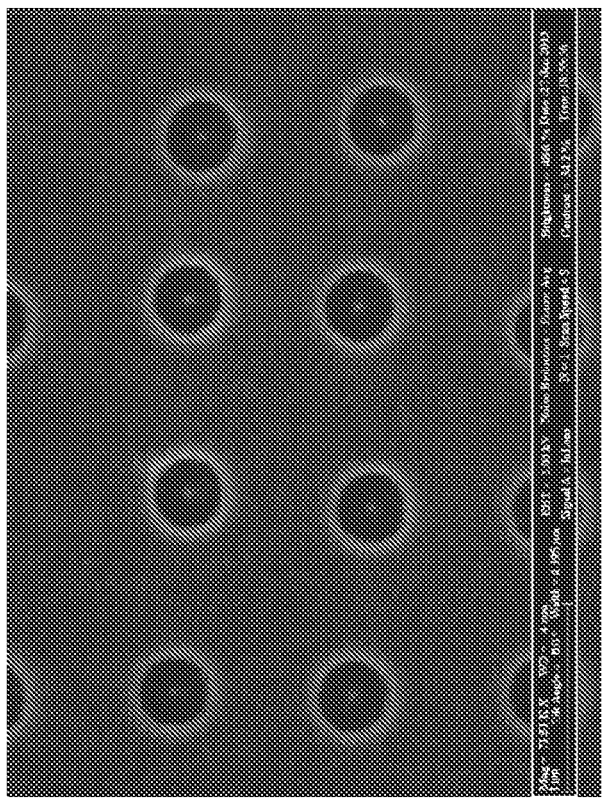
Figure 30:
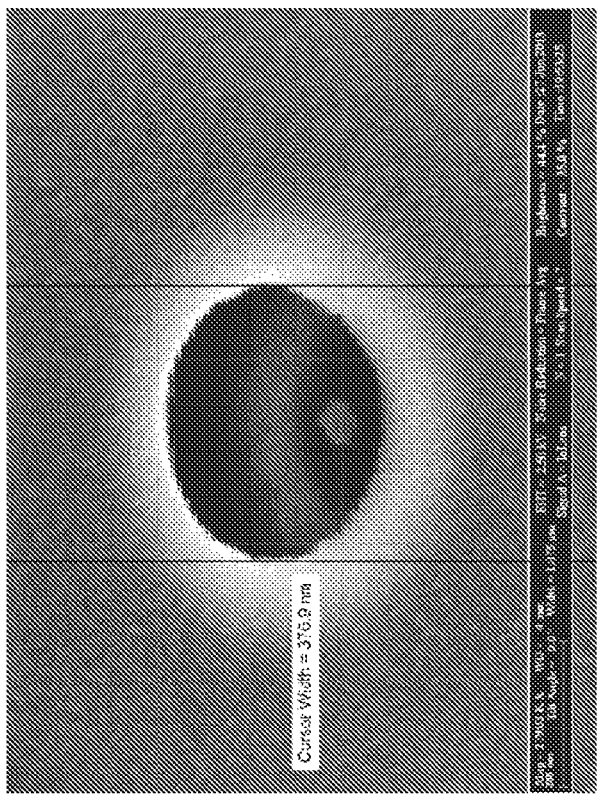

FIGS. 28, 29 and 30 show SEM images of the released tips. SEM analysis is also conducted on dies that are at a distance from the edge of the wafer. FIG. 28 shows a SEM image of an example released field emitter array that is based on a nano-scale silicon field emitter tip disposed on a high aspect ratio field emitter element. The gate aperture of the extraction gate electrode has a diameter of about 300 nm. The pitch of the silicon field emitter tip on post field emitter element structure is about 1 micron. The silicon columns are about 10 microns tall with a lateral dimension (a diameter) of about 200 nm. FIG. 29 shows another SEM image of the example released field emitter array that was taken at an angle. The field emitter tip is estimated as about 100 to about 150 nm below the poly-silicon gate aperture. FIG. 30 shows another SEM image of the example released field emitter array, showing a single gate aperture taken at an angle. The gate aperture diameter is measured at about 380 nm.

Figure 31:
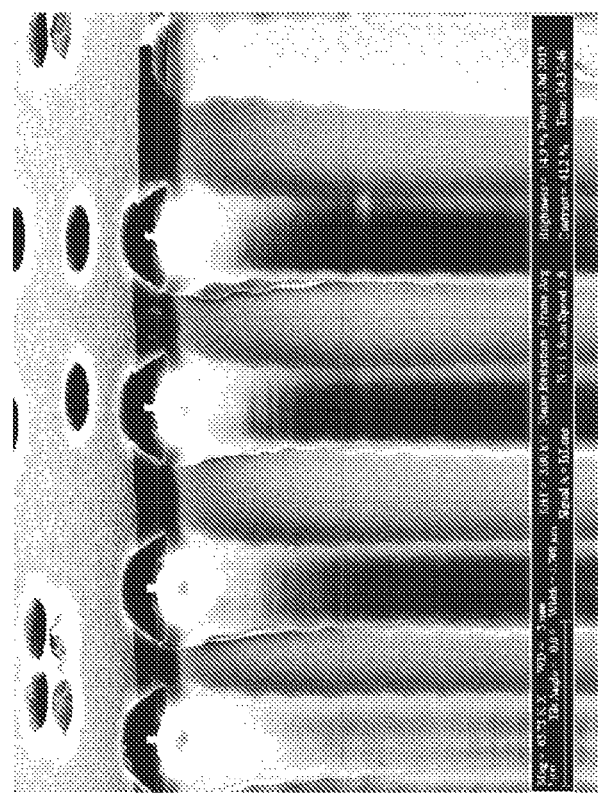
FIGS. 31 and 32 show SEM images of a cleaved portion of an example fabricated field emitter array device, according to the principles described herein.
Figure 32:

FIGS. 31 and 32 show SEM images of a cleaved portion of an example fabricated field emitter array device. The SEM images show that the gaps between the silicon columns appear to be completely filled by a dielectric, gate apertures with about 300 nm to about 350 nm diameter are formed in the poly-silicon layer, and the emitter tips are formed at the top of the columns (field emitter elements). The emitter tips have a shape that deviates from a conical structure, possibly as a result of the die having been taken from the edge of the wafer. The SEM image of FIG. 31 shows the cleaved portion, showing that the gaps between the silicon pillars appears completely filled with a dielectric. The SEM image also shows the formation of a gate aperture in the poly-silicon layer. The SEM of FIG. 32 shows a single field emitter tip formed on a single silicon column. The diameter of the field emitter tip is approximately 20 nm (based on the indicated cursor width).

The non-limiting example fabricated field emission arrays are based on silicon tips with self-aligned emitter extraction gate electrodes and integrated silicon column current limiters. The lead electrodes and contact pads can be fabricated using various techniques. To perform measurements on the example structures fabricated herein, a probe tip in the measurement chamber is used to make electrical contact to the extraction gate electrode at the edge of the array. The results of the measurements can be used to provide an indication the device performance.

Figure 33:
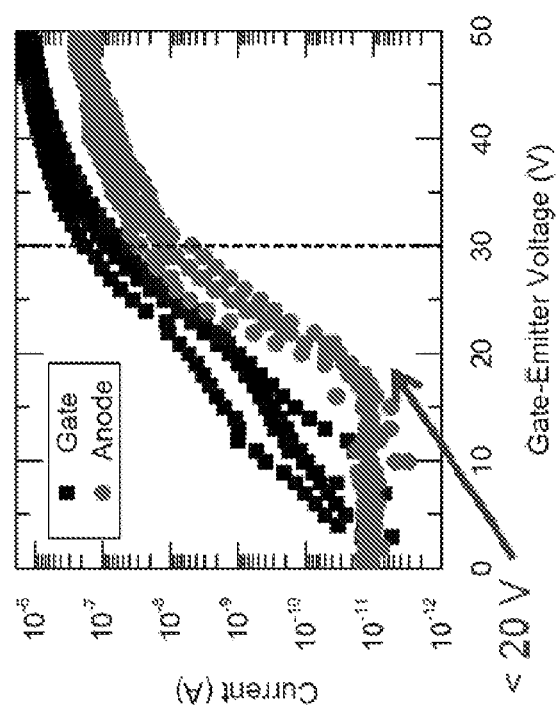
FIG. 33 shows the current voltage characteristics of measurements of an example fabricated field emitter array device, according to the principles described herein.

FIG. 33 shows the current voltage characteristics of measurements of an example fabricated field emitter array device located at the center of the wafer, with the anode biased at about 1100 V. FIG. 33 shows the current-voltage transfer characteristics of the example field emitter array, showing both the gate current and the anode current. The gate voltage is swept between 0 and 50 Volts. The measurement results indicate that there is some interception of the emitted current by the extraction gate electrode. FIG. 33 shows that the example fabricated field emitter array device measured has a turn-on voltage <20V (indicated in FIG. 33), and more specifically between about 15 and about 20 V, and saturates at about 35 V. The dependence of the gate current and the anode current on gate-to-emitter voltage is roughly exponential. The plot of FIG. 33 includes devices that use self-aligned extraction gate electrodes and devices that use suspended mesh extraction gate electrodes. The devices with suspended extraction gate electrodes have mesh structures that are typically more than 10 μm from the field emitter tips with the implication that the field factor can be relatively low and hence $b_{FN}$ values are higher. The data presented also includes devices that do not have high aspect ratio structures. For these structures the implication is that the field factor is lower due to the reduced curvature of the electrostatic equi-potential lines and the values of $b_{FN}$ are higher. For the devices with the self-aligned gates, the field factor is expected to be higher due to the proximity of the extraction gate electrodes and hence higher field factor b and lower $b_{FN}$ values.

Figure 34:
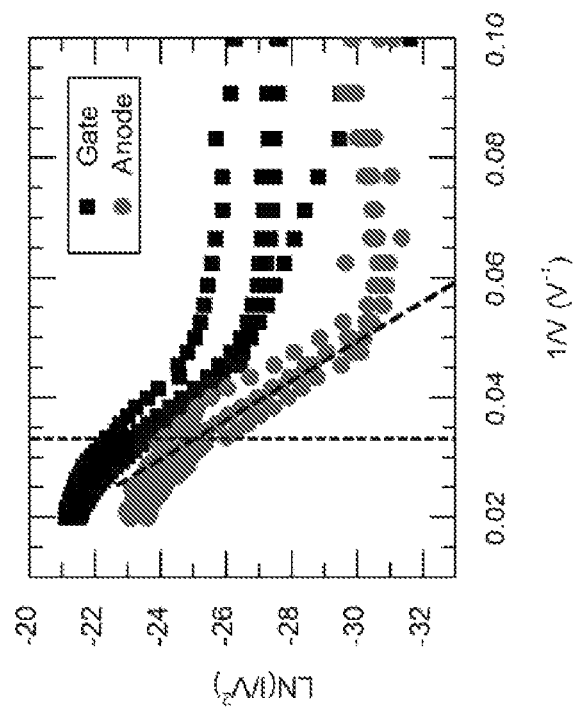
FIG. 34 shows an example Fowler-Nordheim (FN) plot, according to the principles described herein.

FIG. 34 shows an example Fowler-Nordheim (FN) plot of the extraction gate electrode and anode currents and the slope, where $b_{FN}$ is 277 and $LN(a_{FN})$ is −16. The FN plot shows the anode and gate current for a self-aligned gate field emitter array that uses silicon columns as field emitter elements operating as current controlled sources to limit emission current. Considering the shape of the FN plot, the current appears to saturate at high voltages, consistent with other measured example silicon pillar field emitter array devices with similar doping densities.

According to an example system, method and apparatus described herein, a two-dimensional array of closely packed electron sources can be fabricated based on scaled field emission arrays that are individually ballasted by high aspect ratio silicon current limiters (field emitter elements). The example high-aspect-ratio silicon pillar current limiters are configured as vertical ungated field-effect transistors for ballasting individual field emitters within field emitter arrays. The non-limiting example field emitter arrays are fabricated as about 1 μm pitch field emitter arrays that are individually ballasted by about 100 nm diameter and 10 μm tall ungated field-effect transistors (field emitter elements), resulting in an emitter tip radius under about 10 nm. Electrical characterization of the non-limiting example field emitter array devices indicate that slope of the FN plot characteristics $b_{FN}$ is 2942 and the turn-on voltage is $V_{ON}$ of about 150 V. With an approximation that the barrier height is the electron affinity of silicon $\chi$=4.05 eV, the extracted field factor β is about $1.80 \times 10^5$ cm$^{-1}$.

A non-limiting example field emitter arrays can be fabricated with an integrated self-aligned gate, the example field emitter array device having a gate aperture roughly the Si pillar diameter, resulting in turn-on voltages of about 25V and operating voltages of about 75V to about 100 V.

The results in FIG. 33 show that the devices with suspended extraction gate electrodes have higher values of $b_{FN}$ and $V_{ON}$. The results also show that devices that are self-aligned gated emitters have lower values of $b_{FN}$ and $V_{ON}$. The example devices with smaller gate apertures are also observed to have lower values of $b_{FN}$ and $V_{ON}$. The slope of the $V_{ON}$ versus $b_{FN}$ plot is 0.038 V/V with an intercept at 4.16 V (a value close to the barrier height—electron affinity of Si of 4.05 eV). The intercept corresponds to $b_{FN}$ of 0 and hence an infinite field factor (β=∞). This is consistent with tunneling theory in that the turn-on voltage is about the workfunction of surface accumulated n-type silicon which in this case is the electron affinity of Si $\chi$ for an infinite field factor.

Figure 35:
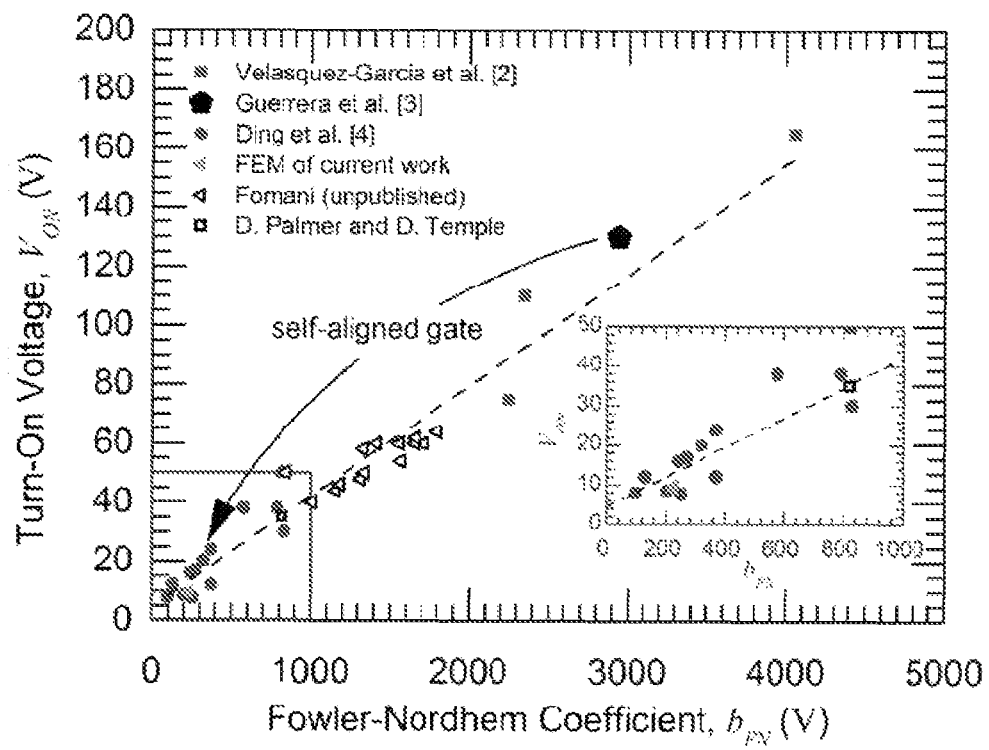
FIG. 35 shows a plot of the slope of the FN curve plot versus anode to emitter separation, according to the principles described herein.
Figure 36:
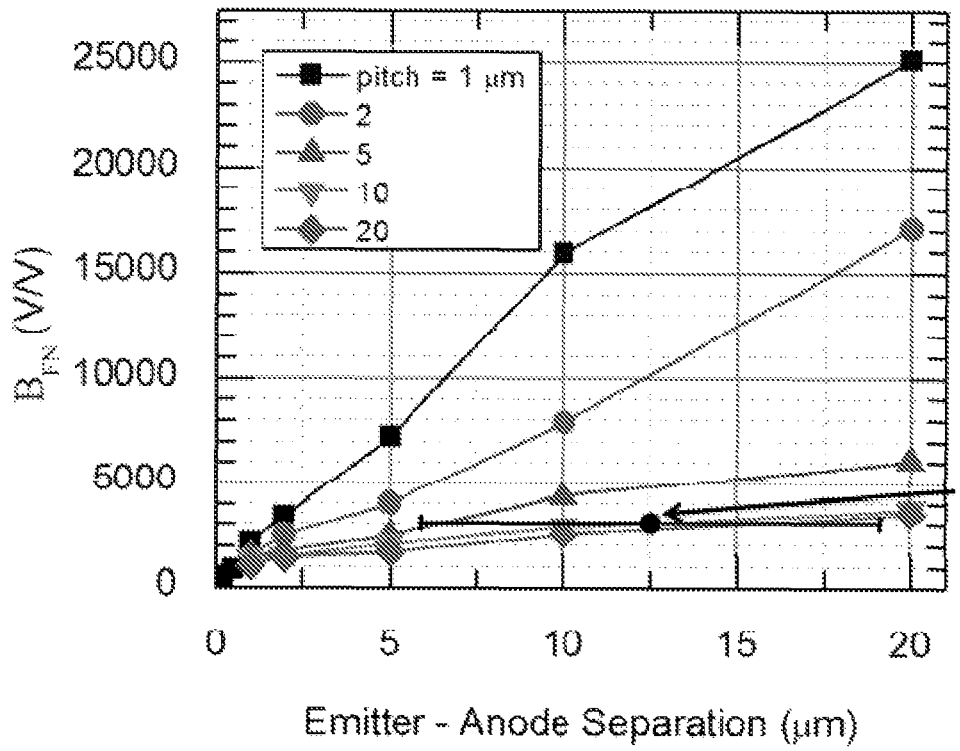
FIG. 36 shows plots of the result of example measurements, according to the principles described herein.

In an example, a 3D electrostatic simulations is conducted of a 2D array of example high aspect ratio silicon field emitter elements with field emitter tips. The example silicon field emitter tips are modeled as having a 5 nm tip radius, the example field emitter elements are modeled as 100 nm diameter current limiters, silicon column height of 10 μm and emitter apex cone angle of 25°. The pitch of the field emitter tips as well as the extraction gate electrode (anode) to tip distance in a diode configuration. From these simulations, the field factor is extracted at the emitter apex and was converted to the slope of the FN plot $b_{FN}$ assuming that workfunction is the electron affinity of Si ($\chi$=4.05 eV). FIG. 35 shows a plot of $b_{FN}$ versus anode (extraction gate to emitter separation with emitter tip pitch as a parameter. It is observed that $b_{FN}$ decreases with increased pitch reflecting the reduction in screening and $b_{FN}$ decreases with anode (extraction gate) to emitter distance reflecting the increased proximity. FIG. 36 shows a plot of the result of example measurements, which as observed to be consistent with the simulations of FIG. 35.

In an example, simulations are performed for a self-aligned device with 100 nm pillar diameter field emitter elements that are 10 microns tall and with field emitter tip radius of 5 nm. The gate aperture for the simulated structure is set at 200 nm. This simulation can be conducted using the SILVACO® suite of simulation tools (Silvaco Inc., Santa Clara, Calif.) to predict field emission current as function of voltage. From the FN plot of the data, a slope $b_{FN}$ of 226 is obtained and from the current-voltage (IV) plot, a $V_{ON}$ of 9 V was obtained. This data point is included in the plot and it falls along the data cluster around the fitting line.

In an example, a linear relationship between the turn-on voltage $V_{ON}$ and the slope of the Fowler Nordheim plot $b_{FN}$ can be modeled using the following expression:

$$V_{ON} \approx \left[ \frac{b_{FN}}{\ln\left[\frac{k_{FN}}{I_{ON}}\right]} \right] \approx \left[ \frac{0.95 B \phi^{3/2}}{\beta \ln\left[\frac{k_{FN}}{I_{ON}}\right]} \right]$$

Figure 37:
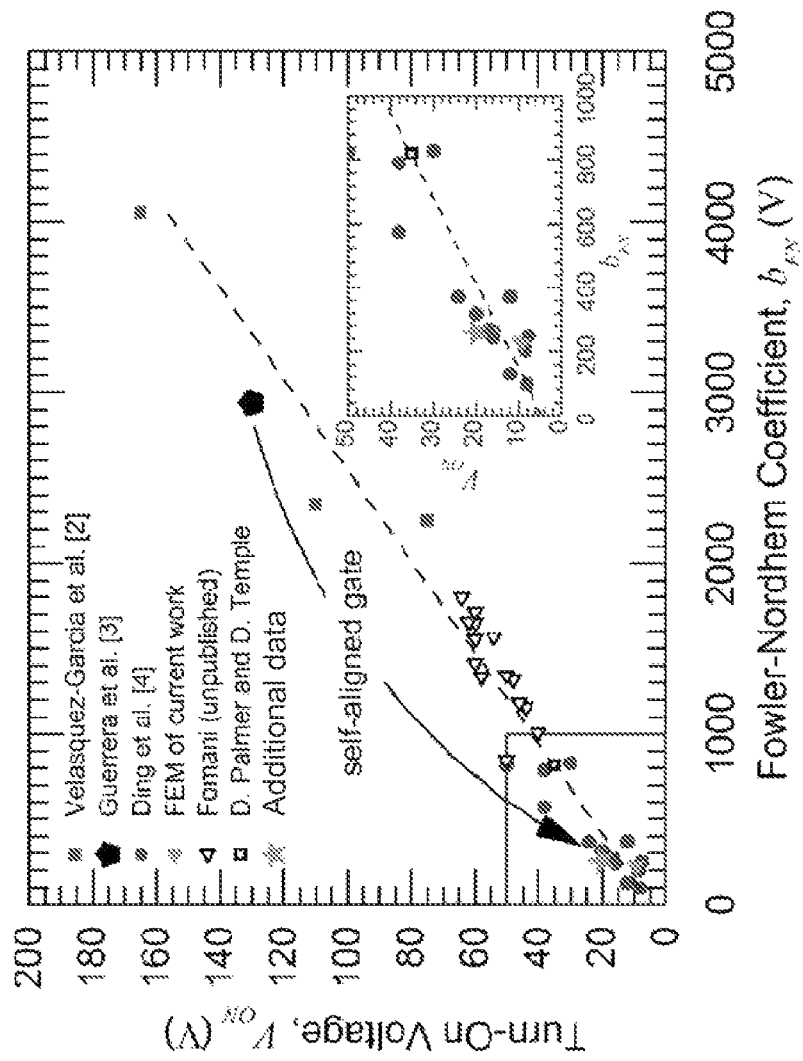
FIG. 37 shows a plot of turn-on voltage VON versus the slope of the FN plot for an example field emitter array, according to the principles described herein.

FIG. 37 shows a plot of the field emitter array turn-on voltage $V_{ON}$ versus the slope of the FN plot $b_{FN}$ for wide range of devices, and not only those with self-aligned gates, suspended mesh gates, conical tips and tip on high aspect ratio column structure. FIG. 37 includes data plotted in FIG. 35 and additional data (represented by a star) of measurement results and simulation. The slope of the line in FIG. 37 is 0.0377 which is comparable to the theoretical value of 0.0376 obtained if the turn-on surface field is assumed to be $2\times10^7$ Vcm$^{-1}$.

FIGS. 38A-38H shows stages in a non-limiting example fabrication process flow for fabricating field emitter arrays including field emitter elements formed as vertical MOSFET. FIG. 38A shows a substrate that is used for the fabrication (in this example, a silicon wafer). FIG. 38B shows the result of an epitaxial growth of a p-doped channel and a n+ doped drain layer on the substrate. FIG. 38C shows the results of an etching process for fabricating field emitter elements 3800 (in this example, as pillars). The field emitter elements 3800 are shown to include a portion of the n+ doped drain layer 3801 and a portion of the p-doped channel region 3802. In FIG. 38D, a gate dielectric layer is grown (in this example, as an oxide). In FIG. 38E, a n+ doped material is deposited to form the MOSFET gate electrode material (to form the gate of the field emitter element transistor). IN FIG. 38F, the n+ doped material is selectively etched to form the MOSFET gate electrodes 3804 that form the transistor gate of the vertical MOSFET, thereby forming a field emitter element as a gated vertical transistor (in this example, a MOSFET). In FIG. 38G, the gaps between the field emitter elements 3800 are filled with a dielectric material and the system is passivated. In FIG. 38H, vias are etched and contacts are formed. In this example, contacts 3806 provide electrical communication with the MOSFET gate electrodes 3804. The field emitter tips over the field emitter elements 3800 are also coated with a conductive material 3808.

Figure 39:
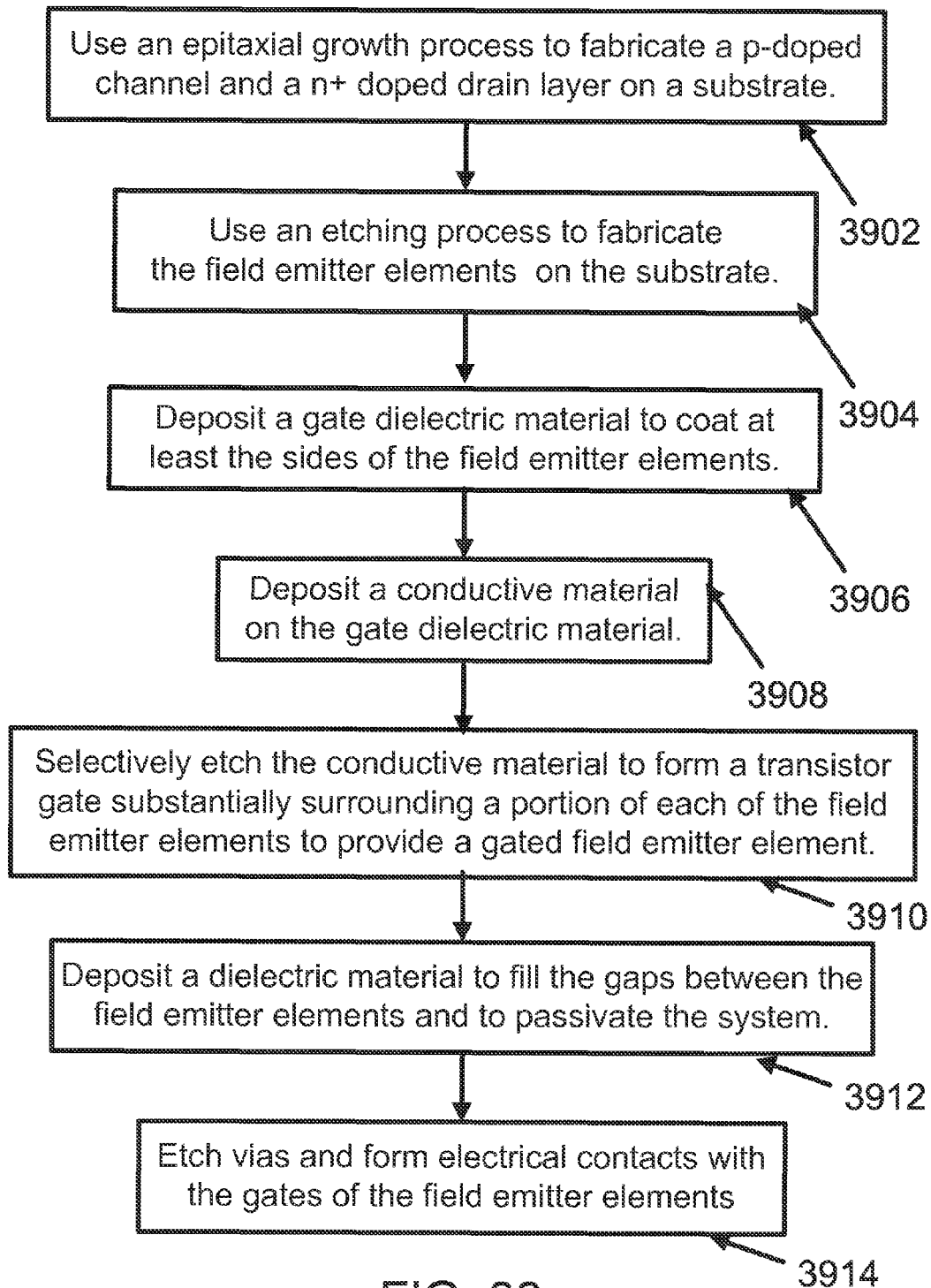
FIG. 39 shows a flowchart of an example process flow for fabricating a field emitter array, according to the principles described herein.

FIG. 39 shows a flowchart of an example process flow for fabricating a field emitter array including field emitter elements formed as gated vertical MOSFET. In block 3902, an epitaxial growth process is used to fabricate a p-doped channel and a n+ doped drain layer on a substrate. In block 3904, an etching process is used to fabricate the field emitter elements on the substrate based on the grown epitaxial layers. In block 3906, a gate dielectric material is deposited to coat at least a portion of the sides of the field emitter elements. In block 3908, a conductive material is deposited on the gate dielectric material. In block 3910, professes are performed to selectively etch the conductive material to form a transistor gate substantially surrounding a portion of each of the field emitter elements to provide a gated field emitter element. In block 3912, a dielectric material is deposited to fill the gaps between the field emitter elements and to passivate the system. In block 3914, vias are etched and electrical contacts are formed with the gates (transistor gate electrodes) of the field emitter elements (formed as MOSFETs in these examples).

Figure 40:
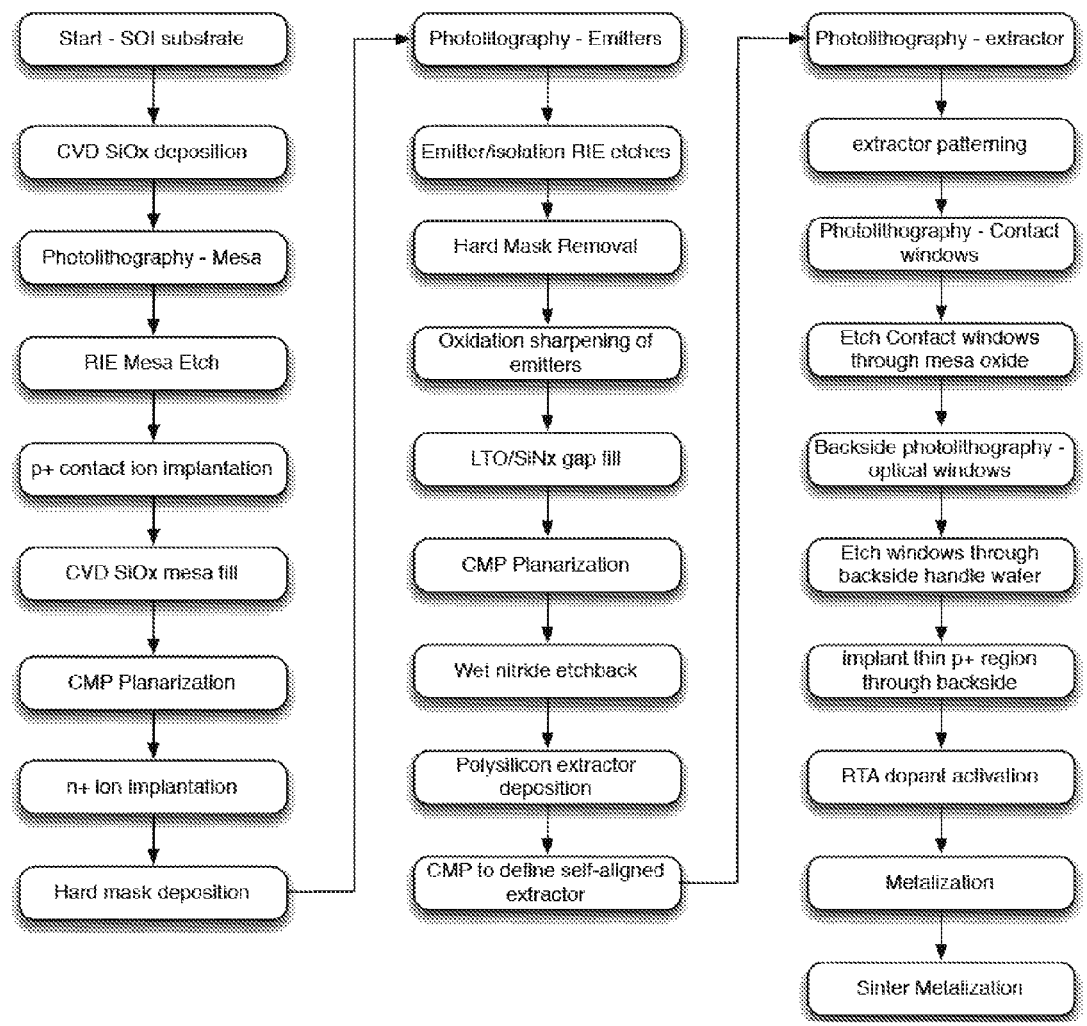
FIG. 40 shows another example process flow for fabricating an example field emitter array, according to the principles described herein.
Figure 41:
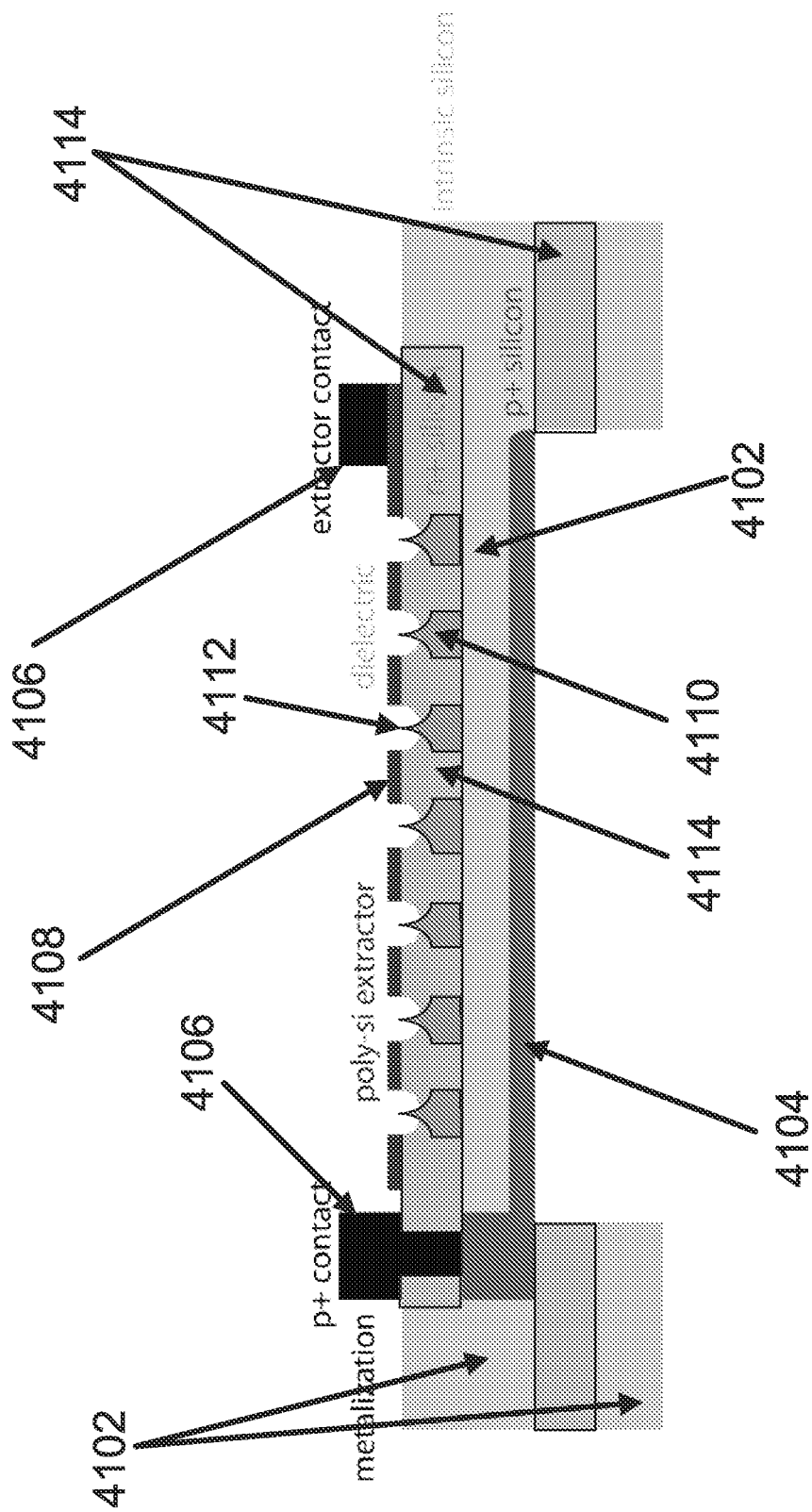
FIG. 41 shows an example field emitter array, according to the principles described herein.

FIG. 40 shows another example process flow for fabricating an example field emitter array according to the principled herein. FIG. 41 shows an example field emitter array according to the principled herein that can be fabricated using the process flow of FIG. 40. The example field emitter array includes a substrate 4102 formed of intrinsic silicon, a p+-doped region 4104 that forms an electrical communication with a p+ contact 4106 for the extraction gate electrodes 4108. The example field emitter array includes a number of field emitter elements 4110, each formed with a field emitter tip 4112. A dielectric material 4114 electrically insulates the field emitter elements 4110 from each other and the extraction gate electrodes 4108. Dielectric material 4114 also electrically insulates the field emitter elements 4110 from the p+-doped region 4104.

The following articles are incorporated by reference in their entirety, including drawings: E. Slot et al., "MAPPER: high throughput maskless lithography," Proc. SPIE, 2008, pp. 69211P-69211P-9; P. Petric et al., "New advances with REBL for maskless high-throughput EBDW lithography," Proc. SPIE, 2011, pp. 797018-797018-14; M. Nagao et al., "Fabrication of a field emitter array with a built-in Einzel lens," Jpn. J. Appl. Phys. 48, 06FK02 (2009).

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways, including through implementations provided in FIGS. 1 to 41 attached hereto. For example, some embodiments may be implemented using hardware, software or a combination thereof. When any aspect of an embodiment is implemented at least in part in software, the software code may be executed on any suitable processor or collection of processors, whether provided in a single device or computer or distributed among multiple devices/computers.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification, unless clearly indicated to the contrary, should be understood to mean "at least one."

The phrase "and/or," as used herein in the specification, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An electron beam apparatus comprising:
   a substrate;
   a plurality of field emitter elements disposed over the substrate in at least one array, each field emitter element of the plurality of field emitter elements comprising:
   a current channel region disposed at a first end of the field emitter element proximate to the substrate;
   a donor-doped region or an acceptor-doped region disposed at a second end of the field emitter element that is different from the first end; and
   a field emitter tip disposed proximate to the second end of the field emitter element;
   and
   at least one extraction gate electrode disposed proximate to the plurality of field emitter elements, to apply a potential difference proximate to at least one field emitter tip of the plurality of field emitter elements, thereby accelerating the electrons emitted from the at least one field emitter tip in a direction away from the at least one field emitter tip,
   wherein each field emitter element of the plurality of field emitter elements further comprises a conductive material surrounding at least a portion of a side of the respective field emitter element.

2. The apparatus of claim 1, wherein each field emitter element of the plurality of field emitter elements has an aspect ratio of height to lateral dimension of about 5:1, about 10:1, about 50:1, about 100:1, about 200:1, about 500:1 about 800:1, about 1000:1, or about 5,000:1.

3. The apparatus of claim 1, wherein the plurality of field emitter elements are disposed at a pitch of about 45 microns, about 40 microns, about 30 microns, about 20 microns, about 15 microns, about 10 microns, about 5 microns, about 2 microns, or about 1 micron.

4. The apparatus of claim 1, wherein the array is a one-dimensional array, a two-dimensional array, or a staggered three-dimensional array.

5. The apparatus of claim 1, wherein each field emitter tip has a radius of about 1 nm, about 2 nm, about 3 nm, about 5 nm, about 8 nm, about 10 nm, about 12 nm, about 15 nm, or about 20 nm.

6. The apparatus of claim 1, wherein the emitted electrons from the plurality of field emitter elements produce an electron beam of brightness about $1\times10^6$ A/cm$^2$/sr, $5\times10^6$ A/cm$^2$/sr, $1\times10^7$ A/cm$^2$/sr, $5\times10^7$ A/cm$^2$/sr, $1\times10^8$ A/cm$^2$/sr, about $5\times10^8$ A/cm$^2$/sr, about $1\times10^9$ A/cm$^2$/sr, or about $5\times10^9$ A/cm$^2$/sr.

7. The apparatus of claim 1, wherein each field emitter element comprises silicon, aluminum, copper, silver, gold, platinum, zinc, nickel, titanium, chromium, palladium, tungsten, molybdenum, diamond, carbon nanofiber, graphene, indium-tin-oxide, or gallium arsenide.

8. The apparatus of claim 1, wherein each field emitter tip comprises an electrically conductive material.

9. The apparatus of claim 8, wherein each field emitter tip comprises a refractory metal, a noble metal, a semiconductor, a semimetal, or a semimetal.

10. The apparatus of claim 1, wherein each field emitter element has a pillar structure, and wherein the pillar structure has a length of about 10 microns and a lateral dimension of about 100 nm.

11. The apparatus of claim 1, wherein a donor-doped region is disposed at the second end of the field emitter element, and wherein a voltage can be applied to the conductive material to regulate an amount of a current flowing through the channel region to the donor-doped region of the respective field emitter element.

12. The apparatus of claim 1, wherein the at least one extraction gate electrode is a plurality of extraction gate electrodes, and wherein each extraction gate electrode of the plurality of extraction gate electrodes is disposed proximate to a respective one or more field emitter elements of the plurality of field emitter elements to apply the potential difference proximate to the respective one or more field emitter elements of the plurality of field emitter elements.

13. The apparatus of claim 12, wherein each extraction gate electrode of the plurality of extraction gate electrodes is formed as a conductive material layer including a hollow opening that is disposed proximate to the one or more field emitter tips of the respective one or more field emitter elements.

14. The apparatus of claim 13, wherein the conductive material layer is disposed proximate to the respective one or more field emitter elements such that the hollow opening is substantially concentric with a portion of at least one field emitter tip of the respective one or more field emitter elements of the plurality of field emitter elements.

15. The apparatus of claim 13, wherein the hollow opening is substantially circular, substantially oval, or substantially polygonal in shape.

16. The apparatus of claim 12, further comprising at least one electrostatic electrode disposed proximate to the plurality of extraction gate electrodes, to shape the electrons accelerated by the at least one extraction gate electrode into at least one focused electron beam.

17. The apparatus of claim 16 wherein the at least one electrostatic electrode comprises a plurality of electrostatic electrodes, and wherein each electrostatic electrode of the plurality of electrostatic electrodes is disposed proximate to a respective extraction gate electrode of the plurality of extraction gate electrodes.

18. The apparatus of claim 16, wherein the at least one electrostatic electrode is at least one of: an electron focusing lens assembly, an additional extraction gate electrode, an Einzel lens, an acceleration grid, and a stigmation corrector.

19. The apparatus of claim 1, wherein the substrate comprises at least one electrically conductive contact region, and wherein the plurality of field emitter elements are in electrical communication with the at least one electrically conductive contact region of the substrate.

20. The apparatus of claim 1, wherein the substrate comprises at least one logic chip, and wherein the plurality of field emitter elements are in electrical communication with the at least one logic chip.

21. The apparatus of claim 20, wherein a donor-doped region is disposed at the second end of the field emitter element, wherein each field emitter element of the plurality of field emitter elements further comprises a conductive material surrounding at least a portion of a side of the respective field emitter element, and wherein the at least one logic chip controls a current or voltage applied to the conductive material of each field emitter element to regulate an amount of a current flowing through the channel region to the donor-doped region of the respective field emitter element.

22. An electron beam apparatus comprising:
a substrate comprising an optically modulated current source;
a plurality of field emitter elements disposed over the substrate in at least one array, each field emitter element of the plurality of field emitter elements comprising:
a current channel region disposed at a first end of the field emitter element proximate to the optically modulated current source; and
a field emitter tip disposed proximate to a second end of the field emitter element that is different from the first end; and
at least one extraction gate electrode disposed proximate to the plurality of field emitter elements, to apply a potential difference proximate to at least one field emitter tip of the plurality of field emitter elements, thereby accelerating electrons emitted from the at least one field emitter tip in a direction away from the at least one field emitter tip;
wherein the optically modulated current source is a P-I-N diode.

23. The apparatus of claim 22, wherein each field emitter element of the plurality of field emitter elements has an aspect ratio of height to lateral dimension of about 5:1, about 10:1, about 50:1, about 100:1, about 200:1, about 500:1, about 800:1, about 1000:1, or about 5,000:1.

24. The apparatus of claim 22, wherein the plurality of field emitter elements are disposed at a pitch of about 45 microns, about 40 microns, about 30 microns, about 20 microns, about 15 microns, about 10 microns, about 5 microns, about 2 microns, or about 1 micron.

25. The apparatus of claim 22, wherein the optically modulated current source generates a current under illumination from electromagnetic radiation.

26. The apparatus of claim 22, wherein the P-I-N diode comprises an acceptor-doped region, a photoactive intrinsic region, and a donor-doped region.

27. The apparatus of claim 22, wherein the at least one extraction gate electrode is a plurality of extraction gate electrodes, and wherein each extraction gate electrode of the plurality of extraction gate electrodes is disposed proximate to a respective one or more field emitter elements of the plurality of field emitter elements to apply the potential difference proximate to the respective one or more field emitter elements of the plurality of field emitter elements.

28. The apparatus of claim 27, wherein each extraction gate electrode of the plurality of extraction gate electrodes is formed as a conductive material layer including a hollow opening that is disposed proximate to the one or more field emitter tips of the respective one or more field emitter elements.

29. The apparatus of claim 28, wherein the conductive material layer is disposed proximate to the respective one or more field emitter elements such that the hollow opening is substantially concentric with a portion of at least one field emitter tip of the respective one or more field emitter elements of the plurality of field emitter elements.

30. The apparatus of claim 28, wherein the hollow opening is substantially circular, substantially oval, or substantially polygonal in shape.

31. The apparatus of claim 27, further comprising at least one electrostatic electrode disposed proximate to the plurality of extraction gate electrodes, to shape the electrons accelerated by the at least one extraction gate electrode into at least one focused electron beam.

32. The apparatus of claim 31 wherein the at least one electrostatic electrode comprises a plurality of electrostatic electrodes, and wherein each electrostatic electrode of the plurality of electrostatic electrodes is disposed proximate to a respective extraction gate electrode of the plurality of extraction gate electrodes.

33. The apparatus of claim 31, wherein the at least one electrostatic electrode is at least one of: an electron focusing lens assembly, an additional extraction gate electrode, an Einzel lens, an acceleration grid, and a stigmation corrector.

34. An electron beam apparatus comprising:
a plurality of current source elements disposed in at least one array, each current source element of the plurality of current source elements comprising:
a gated vertical transistor;
an ungated vertical transistor; or a current controlled channel that is proximate to an optically modulated current source;

a plurality of field emitter tips, each field emitter tip of the plurality of field emitter tips being coupled to an end of a respective current source element of the plurality of current source elements; and at least one extraction gate electrode disposed proximate to the plurality of current source elements, to apply a potential difference proximate to at least one field emitter tip of the plurality of current source elements, wherein the potential difference accelerates the electrons emitted by at least one field emitter tip of the plurality of field emitter tips in a direction away from the at least one field emitter tip.

35. The apparatus of claim 34, further comprising at least one logic control component in electrical communication with each current source element of the plurality of current source elements.

36. The apparatus of 35, wherein the at least one logic control component selectively activates each current source element of the plurality of current source elements to supply electrons to the respective field emitter tip, thereby causing the plurality of field emitter tips to be selectively addressable.

37. The apparatus of claim 35, further comprising at least one conductive interconnect in electrical communication with each current source element and the at least one logic control component.

38. The apparatus of claim 34, wherein the plurality of current source elements are disposed in the at least one array at a pitch of about 45microns, about 40microns, about 30 microns, about 20 microns, about 15 microns, about 10microns, about 5 microns, about 2 microns, or about 1 micron.

39. The apparatus of claim 34, wherein each current source element of the plurality of current source elements has an aspect ratio of height to lateral dimension of about 5:1, about 10:1, about 50:1, about 100:1, about 200:1, about 500:1, about 800:1, about 1000:1, or about 5,000:1.

40. The apparatus of claim 34, wherein each field emitter tip of the plurality of field emitter tips is disposed proximate to the end of the respective current source element that includes a donor-doped region or an acceptor-doped region.

* * * * *